US010353293B2

(12) United States Patent
Ebihara et al.

(10) Patent No.: US 10,353,293 B2
(45) Date of Patent: Jul. 16, 2019

(54) PHOTOSENSITIVE CONDUCTIVE FILM, CONDUCTIVE PATTERN FORMATION METHOD USING SAME, AND CONDUCTIVE PATTERN SUBSTRATE

(71) Applicant: HITACHI CHEMICAL COMPANY, LTD., Tokyo (JP)

(72) Inventors: Masahiko Ebihara, Tokyo (JP); Emiko Oota, Tokyo (JP); Yasuharu Murakami, Tokyo (JP); Hiroshi Yamazaki, Tokyo (JP); Hiroyuki Tanaka, Tokyo (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 1 day.

(21) Appl. No.: 15/026,764

(22) PCT Filed: Aug. 28, 2014

(86) PCT No.: PCT/JP2014/072631
§ 371 (c)(1),
(2) Date: Apr. 1, 2016

(87) PCT Pub. No.: WO2015/049939
PCT Pub. Date: Apr. 9, 2015

(65) Prior Publication Data
US 2016/0238942 A1 Aug. 18, 2016

(30) Foreign Application Priority Data
Oct. 3, 2013 (JP) .................. 2013-208059

(51) Int. Cl.
G03F 7/20 (2006.01)
G03F 7/32 (2006.01)
B32B 27/12 (2006.01)
B32B 27/20 (2006.01)
B32B 3/08 (2006.01)
B32B 5/02 (2006.01)
B32B 27/30 (2006.01)
G03F 7/16 (2006.01)
G03F 7/004 (2006.01)
G03F 7/033 (2006.01)
G03F 7/34 (2006.01)

(52) U.S. Cl.
CPC .................. G03F 7/32 (2013.01); B32B 3/08 (2013.01); B32B 5/02 (2013.01); B32B 27/12 (2013.01); B32B 27/20 (2013.01); B32B 27/30 (2013.01); G03F 7/0047 (2013.01); G03F 7/033 (2013.01); G03F 7/16 (2013.01); G03F 7/20 (2013.01); G03F 7/343 (2013.01); B32B 2262/103 (2013.01); B32B 2264/10 (2013.01); B32B 2264/107 (2013.01); B32B 2457/00 (2013.01); B32B 2457/202 (2013.01)

(58) Field of Classification Search
CPC ...... G03F 7/0047; G03F 7/161; G03F 7/2002; G03F 7/343; G03F 7/033; B32B 2264/105
USPC ........................................ 430/131
See application file for complete search history.

(56) References Cited

U.S. PATENT DOCUMENTS 6,183,935 B1 * 2/2001 Hanabata ................ G03F 7/002
430/270.1
2007/0074316 A1 3/2007 Alden et al.
2011/0165514 A1 * 7/2011 Yamazaki ........... G02F 1/13439
430/270.1
2012/0301825 A1 * 11/2012 Yoshida ................ G03F 7/0047
430/270.1

FOREIGN PATENT DOCUMENTS

| AU | 2006279590 A1 | 2/2007 |
|---|---|---|
| CN | 101465173 A | 6/2009 |
| CN | 102124529 A | 7/2011 |
| CN | 102645840 A | 8/2012 |
| CN | 102763036 A | 10/2012 |
| CN | 103336409 A | 10/2013 |
| JP | 2001-203436 A | 7/2001 |
| JP | 2007257963 A | 10/2007 |
| JP | 4635925 B | 2/2011 |
| JP | 2011164306 A | 8/2011 |
| JP | 2013-039739 A | 2/2013 |
| TW | 201139150 A | 11/2011 |
| WO | 2010021224 A1 | 2/2010 |

OTHER PUBLICATIONS

Office Action in counterpart CN Patent Appln. No. 201480054247.X dated Dec. 5, 2016.
International Search Report of Appln. PCT/JP2014/072631 dated Nov. 25, 2014 in English.
International Preliminary Report on Patentability of Appln. PCT/JP2014/072631 dated Apr. 14, 2016 in English.

* cited by examiner

Primary Examiner — Daborah Chacko-Davis
(74) Attorney, Agent, or Firm — Fitch Even Tabin & Flannery, LLP

(57) ABSTRACT

The conductive pattern formation method according to the present invention comprises a step of providing a photosensitive conductive film including a conductive layer containing conductive fibers, a photosensitive resin layer containing a photosensitive resin and an inorganic filler, and a support film in this order, and laminating the conductive layer and the photosensitive resin layer on a base material such that the conductive layer side is closely bonded to the base material, and a step of exposing and developing the photosensitive resin layer and the conductive layer on the base material to form a conductive pattern.

13 Claims, 10 Drawing Sheets (a)

(b)

(c)

(d)

(a)

(b)

(a)

(b)

(c)

PHOTOSENSITIVE CONDUCTIVE FILM, CONDUCTIVE PATTERN FORMATION METHOD USING SAME, AND CONDUCTIVE PATTERN SUBSTRATE

CROSS-REFERENCE TO RELATED APPLICATIONS

This application is a U.S. national phase application filed under 35 U.S.C. § 371 of International Application No. PCT/JP2014/072631, filed Aug. 28, 2014, designating the United States, which claims priority from Japanese Patent Application No. 2013-208059 filed Oct. 3, 2013, which are hereby incorporated herein by reference in their entirety.

TECHNICAL FIELD

The present invention relates to a photosensitive conductive film, a conductive pattern formation method using the same, and a conductive pattern substrate, and particularly relates to a method of forming a conductive pattern used as electrode wiring of liquid crystal display elements for apparatuses such as flat panel displays, touch panels (touch screens), solar cells, and lightings, and a conductive pattern substrate.

BACKGROUND ART

Liquid crystal display elements and touch panels are used in large electronic apparatuses such as personal computers and televisions, small electronic apparatuses such as car navigation systems, mobile phones, and electronic dictionaries, and display devices for OA and FA apparatuses. In these liquid crystal display elements and touch panels, transparent conductive films are used in part of wirings and pixel electrodes or terminals, which should be transparent. Moreover, transparent conductive films are also used in devices such as solar cells and lightings.

Conventionally, indium oxide tin (ITO), indium oxide, and tin oxide are used as a material for a transparent conductive film because these materials exhibit high transmittance to visible light. Electrodes disposed on substrates for a liquid crystal display element are mainly those having patterned transparent conductive films composed of the above materials.

A method of patterning a transparent conductive film is usually the method of forming a transparent conductive film on a base material such as a substrate, then forming a resist pattern by photolithography, and removing a predetermined portion of the conductive film by wet etching to form a conductive pattern. In the cases of ITO films and indium oxide films, a mixed solution composed of two solutions of hydrochloric acid and ferric chloride is often used as the etching solution.

Although ITO films and tin oxide films are usually formed by sputtering, the properties of transparent conductive films are readily fluctuated according to the difference in the type of sputtering, the power of sputtering, the pressure of the gas, the temperature of the substrate, and the type of the atmosphere gas. Such a fluctuation in film quality of transparent conductive films caused by a variation in sputtering conditions causes a fluctuation in the etching rate during wet etching of the transparent conductive films, readily reducing the yields of products due to failed patterns. Moreover, the conductive pattern formation method comprises a sputtering step, a resist forming step, and an etching step; these steps require long time, and place a great burden in view of cost.

To solve the above problems, attempts to form transparent conductive patterns using a material other than ITO, indium oxide, and tin oxide have been performed recently. For example, Patent Literature 1 below discloses a conductive pattern formation method of forming a conductive layer containing conductive fibers such as silver fibers on a substrate, then forming a photosensitive resin layer on the conductive layer, and exposing the photosensitive resin layer from thereabove through a patterning mask to develop a pattern.

Patent Literature 2 discloses a method of using a conductive film for transfer comprising at least a peelable conductive layer disposed on a support and an adhesive layer disposed on the conductive layer, and bonding the conductive layer to a substrate through the adhesive layer, and also discloses optional patterning of the conductive layer after transfer.

Patent Literature 3 discloses a method of forming a conductive pattern by a method of using a photosensitive conductive film comprising a conductive layer disposed on a support film and a photosensitive resin layer disposed on the conductive layer, and laminating the photosensitive resin layer on a substrate so as to closely bond to the substrate.

CITATION LIST

Patent Literature

Patent Literature 1: U.S. Patent Application Publication No. 2007/0074316

Patent Literature 2: Japanese Unexamined Patent Publication No. 2007-257963

Patent Literature 3: International Publication No. WO 2010/021224

SUMMARY OF INVENTION

Technical Problem

However, a problem arises, that is, the step of forming a conductive pattern is complicated in the methods described in Patent Literatures 1 and 2.

On the other hand, the method described in Patent Literature 3 is a method enabling more simple formation of a conductive pattern; however, connection terminals disposed on the surface of the substrate and the conductive pattern cannot be connected in a simple manner because the photosensitive resin layer is interposed between the substrate and the conductive layer. This problem also arises in the method described in Patent Literature 2.

By the way, as a method of connecting connection terminals disposed on the surface of the substrate and a conductive pattern in a simple manner, the present inventors have found a method of using a photosensitive conductive film in which a photosensitive resin layer and a conductive layer are disposed in this order on a support film, and laminating the conductive layer side on a substrate such that the conductive layer is closely bonded to the substrate. According to this conductive pattern formation method, a conductive pattern having sufficiently low surface resistivity can be formed on a base material in sufficient resolution in a simple manner. Moreover, connection terminals disposed on the surface of the substrate and the conductive pattern can be connected in a simple manner.

However, the method found by the present inventors is susceptible to improvement in a reduction in the contact resistance value between the connection terminals disposed on the surface of the substrate and the conductive pattern.

The present invention provides a conductive pattern formation method in which a conductive pattern having sufficiently low surface resistivity can be formed on a base material in sufficient resolution in a simple manner, and a conductive pattern having sufficiently low contact resistance can be formed even if electrically connected to connection terminals disposed on the surface of the base material. Moreover, the present invention provides a photosensitive conductive film which can be used in the conductive pattern formation method, and a conductive pattern substrate.

Solution to Problem

The conductive pattern formation method according to the present invention comprises a step of providing a photosensitive conductive film including a conductive layer containing conductive fibers, a photosensitive resin layer containing a photosensitive resin and an inorganic filler, and a support film in this order, and laminating the conductive layer and the photosensitive resin layer on a base material such that the conductive layer side is closely bonded to the base material, and a step of exposing and developing the photosensitive resin layer and the conductive layer on the base material to form a conductive pattern.

According to the conductive pattern formation method according to the present invention, a conductive pattern having sufficiently low surface resistivity can be formed on a base material in sufficient resolution in a simple manner, and a conductive pattern having sufficiently low contact resistance can be formed even if electrically connected to connection terminals disposed on the surface of the base material. The present inventors believe that the reason why the contact resistance is reduced is because if the photosensitive resin layer contains an inorganic filler, the pressure applied during lamination is sufficiently conducted to the conductive fibers in the conductive layer.

It is preferred that the photosensitive resin layer contain a binder polymer, a photopolymerizable compound having an ethylenically unsaturated bond, and a photopolymerization initiator.

It is preferred that the binder polymer have a carboxyl group. If a binder polymer having a carboxyl group is contained, the alkali developability of the photosensitive resin layer can be more significantly enhanced.

It is preferred that in the laminate of the conductive layer and the photosensitive resin layer, the minimum light transmittance in the wavelength band of 450 to 650 nm is 80% or more. If the conductive layer and the photosensitive resin layer satisfy such a condition, an increase in luminance of display panels can be facilitated.

It is preferred that the inorganic filler contain an inorganic filler having a primary particle size of 1 to 1000 nm. If the inorganic filler contains an inorganic filler having such a primary particle size, the pressure applied during lamination can be more significantly conducted to the conductive fibers in the conductive layer.

It is preferred that the average primary particle size of the inorganic filler be 200 nm or less. If the average primary particle size of the inorganic filler is controlled within this range, a conductive pattern having higher transparency can be formed, and pattern formability can be also enhanced because light scattering is reduced.

Moreover, the present invention provides a conductive pattern substrate comprising a substrate, and a conductive pattern formed on the substrate by the conductive pattern formation method according to the present invention.

Such a conductive pattern substrate comprises a conductive pattern having sufficiently low surface resistivity formed in sufficient resolution in a simple manner by the conductive pattern formation method according to the present invention, and the conductive pattern can have sufficiently low contact resistance even if electrically connected to connection terminals disposed on the surface of the substrate.

Moreover, the present invention provides a conductive pattern substrate comprising a substrate, and a conductive pattern composed of a conductive layer disposed on the substrate and containing conductive fibers and a cured resin layer disposed on the conductive layer and containing an inorganic filler.

Such a conductive pattern substrate can have sufficiently low contact resistance even if the conductive pattern is electrically connected to connection terminals disposed on the surface of the substrate.

Moreover, the present invention provides a photosensitive conductive film comprising a support film, a photosensitive resin layer containing a photosensitive resin and an inorganic filler, and a conductive layer containing conductive fibers in this order.

According to the photosensitive conductive film according to the present invention, a conductive pattern having sufficiently low surface resistivity can be formed on a base material in sufficient resolution in a simple manner by laminating the conductive layer and the photosensitive resin layer on the base material such that the conductive layer side is closely bonded to the base material and performing exposure and development, and a conductive pattern having sufficiently low contact resistance can be formed even if electrically connected to connection terminals disposed on the surface of the base material.

It is preferred that the inorganic filler contain an inorganic filler having a primary particle size of 1 to 1000 nm. If the inorganic filler contains an inorganic filler having such a primary particle size, the pressure applied during lamination can be more significantly conducted to the conductive fibers in the conductive layer.

It is preferred that the average primary particle size of the inorganic filler be 200 nm or less. If the average primary particle size of the inorganic filler is controlled within this range, a conductive pattern having higher transparency can be formed, and pattern formability can be also enhanced because light scattering is reduced.

Advantageous Effects of Invention

According to the present invention, a photosensitive conductive film in which a conductive pattern having sufficiently low surface resistivity can be formed on a base material in sufficient resolution in a simple manner, a conductive pattern formation method using the same, and a conductive pattern substrate can be provided.

Moreover, according to the present invention, connection terminals disposed on the surface of the base material and the conductive pattern can be connected in a simple manner.

Furthermore, according to the conductive pattern formation method according to the present invention, the adhesiveness between the base material and the conductive layer can be sufficient, and the adhesiveness of the resulting conductive pattern to the substrate can be also sufficient.

Furthermore, according to the present invention, contact between the conductive fibers in the conductive layer and the connection terminals disposed on the surface of the base material can be sufficiently ensured, and thereby a conductive pattern having sufficiently low contact resistance and enabling good electrical connection can be formed.

Although detailed reasons why the present invention attains the effects above are not always clarified, the present inventors infer the reasons as follows: as illustrated in FIG. 9, due to an inorganic filler 8 present in a photosensitive resin layer 3, the pressure when a photosensitive layer 4 (photosensitive resin layer 3 and conductive layer 2) is laminated on a base material 20 with a roller 60 is sufficiently conducted to the conductive fibers in the conductive layer 4 as pressure P to enable sufficient contact between the conductive fibers and connection terminals (not shown) disposed on the surface of the base material.

According to the present invention, steric conductive wiring can be formed in a simple manner because a conductive pattern can be directly formed on the target object. For example, an insulation film is formed with an insulating resin on a predetermined portion of a conductive pattern preliminarily prepared on a base material, the photosensitive conductive film according to the present invention is then laminated to form a conductive pattern; thereby, while the preliminarily prepared conductive pattern not coated with the insulation film is electrically conducted to the newly formed conductive pattern, intersections (bridge portions) in the conductive pattern can be disposed in the portion of the insulation film. In this case, an oxide conductor such as ITO or a metal such as Cu can be used in the preliminarily prepared conductive pattern, and can be easily electrically conducted to these conductive patterns.

DESCRIPTION OF EMBODIMENTS

Hereinafter, suitable embodiments according to the present invention will be described in detail. In the present specification, "(meth)acrylate" indicates "acrylate" and "methacrylate." Similarly, "(meth)acrylic" indicates "acrylic" and "methacrylic," and "(meth)acryloyl" indicates "acryloyl" and "methacryloyl." Moreover, the range of numeric values expressed by using the term "to" indicates the range of the numeric values before and after "to" inclusive as the minimum value and the maximum value, respectively.

The photosensitive conductive film according to the present embodiment comprises a support film, a conductive layer containing conductive fibers, and a photosensitive resin layer containing a photosensitive resin and an inorganic filler.

Moreover, the conductive pattern formation method according to the present embodiment comprises a step of laminating a conductive layer and a photosensitive resin layer on a base material in the photosensitive conductive film such that the conductive layer is closely bonded to the base material, and a step of exposing and developing the photosensitive resin layer and the conductive layer on the base material to form a conductive pattern.

In the present specification, the boundary between the conductive layer and the photosensitive resin layer does not always need to be clear. The conductive layer may have conductivity in the planar direction of the photosensitive layer, and may have a mixed aspect of the conductive layer and the photosensitive resin layer. For example, the conductive layer may be impregnated with a composition forming the photosensitive resin layer, or a composition forming the photosensitive resin layer may be present on the surface of the conductive layer.

Figure 1:
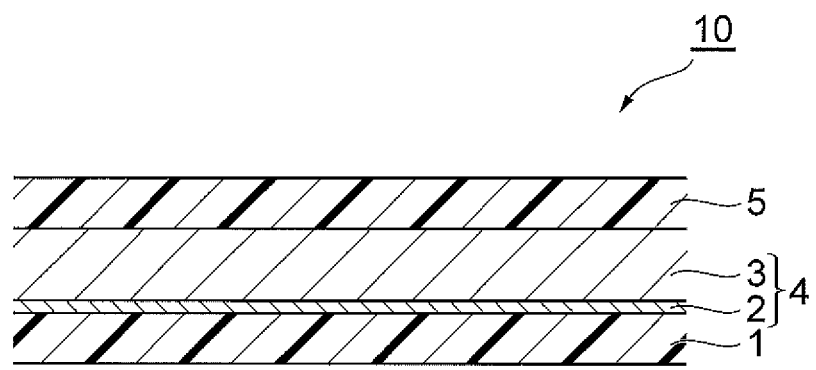
FIG. 1 is a schematic sectional view illustrating an example of a photosensitive conductive film.

FIG. 1 is a schematic sectional view illustrating an example of the photosensitive conductive film. A photosensitive conductive film 10 illustrated in FIG. 1 comprises a first film (cover film) 1, a photosensitive layer 4 disposed on the first film 1, and a second film (support film) 5 disposed on the photosensitive layer 4. The photosensitive layer 4 is composed of a conductive layer 2 disposed on the cover film 1 and containing conductive fibers and a photosensitive resin layer 3 disposed on the conductive layer 2 and containing a photosensitive resin and an inorganic filler.

Hereinafter, the cover film 1, the conductive layer 2 containing conductive fibers, the photosensitive resin layer 3, the photosensitive resin and the inorganic filler contained in the photosensitive resin layer 3, and the support film 5, which form the photosensitive conductive film 10, each will be described in detail.

Examples of the cover film 1 include polymer films having heat resistance and solvent resistance, such as polyethylene terephthalate films, polyethylene films, polypropylene films, and polycarbonate films. Among these polymer films, polyethylene terephthalate films and polypropylene films are preferred from the viewpoint of transparency and heat resistance.

It is preferred that the polymer film be subjected to a releasing treatment so as to be readily peeled from the conductive layer 2 later.

In the present embodiment, the cover film 1 can be configured to be peelable more preferentially than the support film 5. For such a configuration, it is preferred that the bonding strength between the support film 5 and the photosensitive resin layer 3 be larger than that between the conductive layer 2 and the cover film 1. It is preferred that the thicknesses of these polymer films be adjusted, the materials for these be selected, and a surface treatment be performed on these polymer films such that the polymer films are peelable more readily than the support film 5. If the thickness is adjusted, the ratio of the thickness of the cover film 1 to the thickness of the support film 5 is preferably 1:1 to 1:10, more preferably 1:1.5 to 1:5, still more preferably 1:2 to 1:5.

Examples of the conductive fibers contained in the conductive layer 2 include metal fibers of gold, silver, and platinum, and carbon fibers such as carbon nanotubes. These conductive fibers can be used singly or in combinations of two or more. From the viewpoint of conductivity, use of gold fibers and/or silver fibers is preferred, and use of silver fibers is more preferred from the viewpoint that the conductivity of the conductive pattern to be formed can be easily adjusted. These gold fibers and silver fibers can be used singly or in combinations of two or more.

The metal fibers can be prepared by a method of reducing metal ions with a reducing agent such as $NaBH_4$ or a polyol method, for example. Moreover, commercially available products such as Hipco single-walled carbon nanotube manufactured by Unidym, Inc. can be used as the carbon nanotubes.

The fiber diameter of the conductive fibers is preferably 1 to 50 nm, more preferably 2 to 20 nm, particularly preferably 3 to 10 nm. Moreover, the fiber length of the conductive fibers is preferably 1 to 100 μm, more preferably 2 to 50 μm, particularly preferably 3 to 10 μm. The fiber diameter and the fiber length can be measured with a scanning electron microscope.

Although the thickness of the conductive layer 2 is varied according to the conductive pattern formed using the photosensitive conductive film according to the present invention, its application, or the conductivity required, the thickness is preferably 1 μm or less, more preferably 1 nm to 0.5 μm, particularly preferably 5 nm to 0.1 μm. At a thickness of the conductive layer 2 of 1 μm or less, the light transmittance in the wavelength band of 450 to 650 nm is high and pattern formability is high, and such a thickness is particularly suitable for preparation of transparent electrodes. The thickness of the conductive layer 2 indicates the value measured with a scanning electron microscope photograph.

It is preferred that the conductive layer 2 have a network structure composed of contacting conductive fibers. The conductive layer 2 having such a network structure may be formed on the surface of the photosensitive resin layer 3 on the cover film side, or may be formed in the form of a conductive layer included in the surface layer of the photosensitive resin layer 3 on the support film side if conductivity is obtained in the planar direction of the surface exposed when the cover film is peeled.

The conductive layer 2 containing conductive fibers can be formed, for example, by applying a conductive fiber dispersion liquid, in which the above-described conductive fibers and when necessary a dispersion stabilizer such as a surfactant are added to water and/or an organic solvent, onto the cover film 1, and drying the coating. Moreover, after drying, pressure may be further applied to the conductive layer 2 formed. The contact points between the conductive fibers can be increased through formation of the conductive layer under pressure to enhance the conductivity. The line pressure at this time is preferably 0.6 to 2.0 MPa, more preferably 1.0 to 1.5 MPa. In the conductive layer 2, the conductive fibers may be present with the surfactant and the dispersion stabilizer.

Application can be performed, for example, by a known method such as roll coating, comma coating, gravure coating, air knife coating, die coating, bar coating, or spray coating. Moreover, drying can be performed at 30 to 150° C. for about 1 to 30 minutes in a hot air convection dryer.

The photosensitive resin layer 3 is a layer containing a photosensitive resin and an inorganic filler. Examples of the photosensitive resin layer 3 include those formed of photosensitive resin compositions containing (A) a binder polymer, (B) a photopolymerizable compound having an ethylenically unsaturated bond, (C) a photopolymerization initiator, and (D) an inorganic filler.

Examples of the (A) binder polymer include acrylic resins, styrene resins, epoxy resins, amide resins, amide epoxy resins, alkyd resins, and phenol resins. These resins can be used singly or in combinations of two or more.

The (A) binder polymer can be produced through radical polymerization of a polymerizable monomer, for example. Examples of the polymerizable monomer include polymerizable styrene derivatives having substitutions in an α-position or an aromatic ring such as styrene, vinyltoluene, α-methylstyrene; acrylamides such as diacetoneacrylamide; acrylonitriles; ethers of vinyl alcohol such as vinyl-n-butyl ether; (meth)acrylate esters such as alkyl (meth)acrylate esters, aryl (meth)acrylate esters, tetrahydrofurfuryl (meth) acrylate ester, dimethylaminoethyl (meth)acrylate ester, diethylaminoethyl (meth)acrylate ester, glycidyl (meth)acrylate ester, 2,2,2-trifluoroethyl (meth)acrylate, 2,2,3,3-tetrafluoropropyl (meth)acrylate; (meth)acrylic acid, α-bromoacrylic acid, α-chloroacrylic acid, β-furylacrylic acid, β-styrylacrylic acid, maleic acid, maleic anhydride, maleic acid monoesters such as monomethyl maleate, monoethyl maleate, monoisopropyl maleate, and cyclohexyl maleate, fumaric acid, cinnamic acid, α-cyanocinnamic acid, itaconic acid, crotonic acid, and propiolic acid.

Examples of the alkyl (meth)acrylate ester include methyl (meth)acrylate ester, ethyl (meth)acrylate ester, propyl (meth)acrylate ester, butyl (meth)acrylate ester, pentyl (meth)acrylate ester, hexyl (meth)acrylate ester, heptyl (meth)acrylate ester, octyl (meth)acrylate ester, 2-ethylhexyl (meth)acrylate ester, nonyl (meth)acrylate ester, decyl (meth)acrylate ester, undecyl (meth)acrylate ester, dodecyl (meth)acrylate ester, and dicyclopentanyl (meth)acrylate.

Examples of the aryl (meth)acrylate ester include benzyl (meth)acrylate.

Other examples of the polymerizable monomer include bifunctional (meth)acrylate esters. Specifically, examples thereof include ethylene glycol di(meth)acrylate, diethylene glycol di(meth)acrylate, triethylene glycol di(meth)acrylate, propylene glycol di(meth)acrylate, dipropylene glycol di(meth)acrylate, and tripropylene glycol di(meth)acrylate. These (meth)acrylate esters can be used singly or in combinations of two or more.

In the present embodiment, it is preferred that the (A) binder polymer be (a) (meth)acrylic acid, and (b) a copolymer containing a structural unit derived from alkyl (meth) acrylate ester.

From the viewpoint of higher alkali developability, it is preferred that the (A) binder polymer have a carboxyl group. Examples of the polymerizable monomer having a carboxyl group to obtain such a binder polymer include (meth)acrylic acids described above.

The proportion of the carboxyl group contained in the (A) binder polymer, as the proportion of the polymerizable monomer having a carboxyl group to the total polymerizable monomer used to obtain the binder polymer is preferably 10 to 50 mass %, more preferably 12 to 40 mass %, particularly preferably 15 to 30 mass %, extremely preferably 15 to 25 mass %. A proportion of 10 mass % or more is preferred in view of high alkali developability, and a proportion of 50 mass % or less is preferred in view of high alkali resistance.

The weight average molecular weight of the (A) binder polymer is preferably 10000 to 200000; in view of resolution, the weight average molecular weight is preferably 15000 to 150000, more preferably 30000 to 150000, still more preferably 30000 to 100000. The weight average molecular weight can be determined on the same conditions as those used in Examples in the specification of the present application.

A photopolymerizable compound having an ethylenically unsaturated bond can be used as the photopolymerizable compound as the (B) component.

Examples of the photopolymerizable compound having an ethylenically unsaturated bond include monofunctional vinyl monomers, bifunctional vinyl monomers, and polyfunctional vinyl monomers having at least three polymerizable ethylenically unsaturated bonds.

Examples of the monofunctional vinyl monomers include the polymerizable monomers used in synthesis of copolymers, which are described above as suitable examples of the (A) component.

Examples of the bifunctional vinyl monomers include polyethylene glycol di(meth)acrylate, trimethylolpropane di(meth)acrylate, polypropylene glycol di(meth)acrylate; bisphenol A polyoxyethylene di(meth)acrylate (2,2-bis(4-(meth)acryloxypolyethoxyphenyl)propane), bisphenol A diglycidyl ether di(meth)acrylate; and esterified products of polyvalent carboxylic acids (such as phthalic anhydride) and substances having a hydroxy group and an ethylenically unsaturated bond (such as β-hydroxyethyl acrylate and β-hydroxyethyl methacrylate).

Examples of the polyfunctional vinyl monomers having at least three polymerizable ethylenically unsaturated bonds include compounds obtained through a reaction of polyhydric alcohols such as trimethylolpropane tri(meth)acrylate, tetramethylolmethane tri(meth)acrylate, tetramethylolmethane tetra(meth)acrylate, dipentaerythritol penta(meth)acrylate, and dipentaerythritol hexa(meth)acrylate with α,β-unsaturated carboxylic acids; and compounds obtained through addition of α,β-unsaturated carboxylic acid to glycidyl group-containing compounds such as trimethylolpropane triglycidyl ether triacrylate.

Examples of the (C) photopolymerization initiator include aromatic ketones such as benzophenone, N,N,N',N'-tetramethyl-4,4'-diaminobenzophenone (Michler's ketone), N,N,N',N'-tetraethyl-4,4'-diaminobenzophenone, 4-methoxy-4'-dimethylaminobenzophenone, 2-benzyl-2-dimethylamino-1-(4-morpholinophenyl)-butanone-1, and 2-methyl-1-[4-(methylthio)phenyl]-2-morpholino-propanone-1; benzoin ether compounds such as benzoin methyl ether, benzoin ethyl ether, and benzoin phenyl ether; benzoin compounds such as benzoin, methyl benzoin, and ethyl benzoin; oxime ester compounds such as 1,2-octanedione,1-[4-(phenylthio) phenyl-,2-(O-benzoyloxime)], and ethanone,1-[9-ethyl-6-(2-methylbenzoyl)-9H-carb azo-3-yl]-,1-(O-acetyloxime); phosphine oxide compounds such as 2,4,6-trimethylbenzoyl-diphenyl-phosphine oxide; benzyl derivatives such as benzyl dimethyl ketal; 2,4,5-triarylimidazole dimers such as 2-(o-chlorophenyl)-4,5-diphenylimidazole dimers, 2-(o-chlorophenyl)-4,5-di(methoxyphenyl)imidazole dimers, 2-(o-fluorophenyl)-4,5-diphenylimidazole dimers, 2-(o-methoxyphenyl)-4,5-diphenylimidazole dimers, and 2-(p-methoxyphenyl)-4,5-diphenylimidazole dimers; acridine derivatives such as 9-phenylacridine and 1,7-bis(9,9'-acridinyl)heptane; N-phenylglycine, N-phenylglycine derivatives, and oxazole compounds. Moreover, substituents for the aryl groups of the two 2,4,5-triarylimidazoles may be identical to give a symmetric compound, or may be different to give an asymmetric compound. Moreover, a thioxanthone-based compound may be combined with a tertiary amine compound, for example a combination of diethylthioxanthone and dimethylaminobenzoic acid.

Among these photopolymerization initiators, oxime ester compounds or phosphine oxide compounds are preferred in view of the transparency of the photosensitive resin layer to be formed and the pattern formability in the form of a thin film.

The amount of the (A) binder polymer to be compounded is preferably 40 to 80 parts by mass, more preferably 50 to 70 parts by mass relative to 100 parts by mass of the total amount of the (A) binder polymer and the (B) photopolymerizable compound having an ethylenically unsaturated bond. At an amount to be compounded of 40 parts by mass or more, coatability (applicability) is high, and a phenomenon in which the resin bleeds out form ends of the photosensitive conductive film (also called edge fusion) can be more significantly prevented. Moreover, at an amount to be compounded of 80 parts by mass or less, sensitivity can be enhanced, and sufficient mechanical strength can be obtained.

The amount of the (B) photopolymerizable compound having an ethylenically unsaturated bond to be compounded is preferably 20 to 60 parts by mass, more preferably 30 to 50 parts by mass relative to 100 parts by mass of the total amount of the (A) binder polymer and the (B) photopolymerizable compound having an ethylenically unsaturated bond. At an amount to be compounded of 20 parts by mass or more, sensitivity can be enhanced, and sufficient mechanical strength can be obtained. Moreover, at an amount to be compounded of 60 parts by mass or less, coatability (applicability) is high, and edge fusion can be more significantly prevented.

The amount of the (C) photopolymerization initiator to be compounded is preferably 0.1 to 20 parts by mass, more preferably 0.2 to 10 parts by mass relative to 100 parts by mass of the total amount of the (A) binder polymer and the (B) photopolymerizable compound having an ethylenically unsaturated bond. At an amount to be compounded of 0.1 parts by mass or more, sensitivity can be enhanced. At an amount to be compounded of 20 parts by mass or less, curing of the photosensitive resin layer by exposure can be more uniformly performed.

The (D) inorganic filler is not particularly limited; examples thereof include silica ($SiO_2$), zirconium oxide ($ZrO_2$), titanium oxide ($TiO_2$), alumina ($Al_2O_3$), boron nitride (BN), zinc oxide ($ZnO_2$), and ITO (indium tin oxide). These fillers can be used singly or in combinations of two or more. Among these fillers, silica ($SiO_2$) is preferred from the viewpoint of availability and price. Moreover, zirconium oxide ($ZrO_2$) and titanium oxide ($TiO_2$) are preferred from the viewpoint of an increase in the refractive index of the photosensitive resin layer 3.

If the photosensitive resin layer 3 contains the (D) inorganic filler, the pressure applied during lamination of the photosensitive layer (photosensitive resin layer and conductive layer) on the base material can be sufficiently conducted to the conductive fibers in the conductive layer to sufficiently ensure the contact between the conductive fibers and the connection terminals disposed on the surface of the base material.

It is preferred that the (D) inorganic filler contain an inorganic filler having a primary particle size of 1 to 1000 nm; it is more preferred that the (D) inorganic filler contain an inorganic filler having a primary particle size of 3 to 500 nm; it is still more preferred that the (D) inorganic filler contain an inorganic filler having a primary particle size of 5 to 300 nm. If an inorganic filler having such a primary particle size is contained, the pressure applied during lamination can be sufficiently conducted to the conductive fibers in the conductive layer. Moreover, it is preferred that the average primary particle size of the (D) inorganic filler be 200 nm or less. If the average primary particle diameter of the inorganic filler is controlled within this range, a conductive pattern having high light transmittance in the wavelength band of 450 to 650 nm and high transparency can be formed. Moreover, use of such an inorganic filler increases the light transmittance in the wavelength band of 450 to 650 nm, and reduces light scattering; therefore, and pattern formability is also high, and such an inorganic filler particularly suitable for preparation of the transparent electrodes. From the viewpoint of the transparency of the conductive pattern and the pattern formability, the average primary particle size of the inorganic filler is preferably 200 nm or less, more preferably 5 to 100 nm, still more preferably 10 to 50 nm. At an average of the primary particle size of the inorganic filler of 5 nm or more, a reduction in transparency and pattern formability caused by aggregation of the inorganic filler can be sufficiently prevented. These inorganic fillers may be used singly, or in combinations of two or more of those having different primary particle sizes.

The primary particle size of the inorganic filler in the photosensitive resin layer 3 can be measured as follows. First, a photosensitive conductive film or a conductive pattern prepared using the film is prepared into a sample of a thin film piece by an ultramicrotome method, a focused ion beam processing method, or a cryo-ultramicrotome processing method to cut out the cross section of the photosensitive resin layer 3. Subsequently, the sample of a thin film piece is observed with a TEM (transmission electron microscope) at a magnification of 100000 times to 300000 times; thereby, the primary particle size of the inorganic filler in the photosensitive resin layer 3 can be directly measured. If the inorganic filler has a plate-like shape or a needle shape, the long side (the longest length of the distance between two points) is defined as the particle size. Moreover, the inorganic filler may be partially contained in the conductive layer. In the average primary particle size of the inorganic filler in the photosensitive resin layer 3, all of the particle sizes in the region (2 µm ×2 µm) containing the largest number of inorganic fillers in the cross section observed with the TEM are measured, and the average value was defined as the average primary particle size.

The content of the (D) inorganic filler is preferably 20 to 70 parts by mass, more preferably 30 to 60 parts by mass, still more preferably 40 to 50 parts by mass when the total amount of the solid content in the photosensitive resin composition is taken as 100 parts by mass. At a content of the inorganic filler of 20 parts by mass or more, the pressure applied during lamination can be sufficiently conducted to the conductive fibers in the conductive layer to sufficiently contact the conductive fibers with the connection terminals disposed on the surface of the base material, sufficiently reducing the contact resistance value. Moreover, at a content of the inorganic filler of 70 parts by mass or less, reduction in handling properties of the photosensitive resin layer and the adhesion to the base material can be prevented; moreover, a reduction in the transparency of the photosensitive layer can be prevented to ensure pattern formability in sufficient resolution.

More specifically, if the primary particle size of the inorganic filler is 1 to 1000 nm, the content of the (D) inorganic filler is preferably 20 to 50 parts by mass when the total amount of the solid content in the photosensitive resin composition is taken as 100 parts by mass. Moreover, if the primary particle size of the inorganic filler is 3 to 500 nm, the content of the (D) inorganic filler is preferably 20 to 60 parts by mass when the total amount of the solid content in the photosensitive resin composition is taken as 100 parts by mass. Furthermore, if the primary particle size of the inorganic filler is 5 to 300 nm, the content of the (D) inorganic filler is preferably 20 to 70 parts by mass when the total amount of the solid content in the photosensitive resin composition is taken as 100 parts by mass.

It is preferred from the viewpoint of transparency and pattern formability that the content of the inorganic filler having a primary particle size of 500 nm to 1000 nm be controlled within 50 parts by mass relative to 100 parts by mass of the total amount of the solid content in the photosensitive resin composition. The same is true if such an inorganic filler is used in combination with another inorganic filler having a different primary particle size.

As the (D) inorganic filler, those ground with a mill may be used to be dispersed in the photosensitive resin composition, and those classified may be used when necessary. Moreover, the dispersibility in the photosensitive resin composition can be improved preferably by performing the surface treatment of the inorganic filler using a surfactant such as a silane coupling agent.

As the silane coupling agent, those usually available can be used, and examples thereof include alkylsilane, alkoxysilane, vinylsilane, epoxysilane, aminosilane, acrylic silane, methacrylic silane, mercaptosilane, sulfidesilane, isocyanatesilane, sulfursilane, styrylsilane, and alkylchlorosilane.

Examples of specific compound names include methyl trimethoxysilane, dimethyldimethoxysilane, trimethylmethoxysilane, methyltriethoxysilane, methyltriphenoxysilane, ethyltrimethoxysilane, n-propyltrimethoxysilane, diisopropyldimethoxysilane, isobutyltrimethoxysilane, diisobutyldimethoxysilane, isobutyltriethoxysilane, n-hexyltrimethoxysilane, n-hexyltriethoxysilane, cyclohexylmethyldimethoxysilane, n-octyltriethoxysilane, n-dodecylmethoxysilane, phenyltrimethoxysilane, diphenyldimethoxysilane, triphenylsilanol, methyltrichlorosilane, dimethyldichlorosilane, trimethylchlorosilane, n-octyldimethylchlorosilane, tetraethoxysilane, 3-aminopropyltrimethoxysilane, 3-aminopropyltriethoxysilane, 3-(2-aminoethyl)aminopropyltrimethoxysilane, 3-(2-(aminoethyl)aminopropylmethyldimethoxysilane, 3-phenylaminopropyltrimethoxysilane, 3-glycidoxypropyltrimethoxysilane, 3-glycidoxypropylmethyldimethoxysilane, 3-glycidoxypropyltriethoxysilane, 3-glycidoxypropylmethyldiethoxysilane, bis(3-(triethoxysilyl)propyl)disulfide, bis(3-(triethoxysilyl)propyl)tetrasulfide, vinyltriacetoxysilane, vinyltrimethoxysilane, vinyltriethoxysilane, vinyltriisopropoxysilane, allyltrimethoxysilane, diallyldimethylsilane, 3-methacryloxypropyltrimethoxysilane, 3-methacryloxypropylmethyldimethoxysilane, 3-methacryloxypropyltriethoxysilane, 3-mercaptopropyltrimethoxysilane, 3-mercaptopropylmethyldimethoxysilane, 3-mercaptopropyltriethoxysilane, N-(1,3-dimethylbutylidene)-3-aminopropyltriethoxysilane, and aminosilane.

Preferred specific examples of the silane coupling agent include epoxysilane, mercaptosilane, isocyanatesilane, acrylic silane, and methacrylic silane.

The photosensitive resin layer 3 can be formed by applying a solution of a photosensitive resin composition dissolved in a solvent such as methanol, ethanol, acetone, methyl ethyl ketone, methyl cellosolve, ethyl cellosolve, toluene, N,N-dimethylformamide, propylene glycol monomethyl ether or a mixed solvent thereof, when necessary, and having a solid content of about 10 to 60 mass % onto the conductive layer 2 formed on the cover film 1, and drying the coating. In this case, it is preferred that the amount of the residual organic solvent in the photosensitive resin layer after drying be 2 mass % or less to prevent diffusion of the organic solvent in the subsequent step.

Application can be performed by a known method such as roll coating, comma coating, gravure coating, air knife coating, die coating, bar coating, or spray coating. After application, drying for removing the organic solvent can be performed at 70 to 150° C. for about 5 to 30 minutes in a hot air convection dryer.

Although the thickness of the photosensitive resin layer 3 is varied according to the applications, the thickness after drying is preferably 0.05 to 50 μm, more preferably 0.05 to 15 μm, still more preferably 0.1 to 10 μm, particularly preferably 0.1 to 8 μm, extremely preferably 0.1 to 5 μm. At a thickness of 0.05 μm or more, formation of the photosensitive resin layer 3 through application is facilitated. Moreover, at a thickness of 50 μm or less, light transmission is good, sufficient sensitivity can be obtained, and the photocurability of the photosensitive layer after transfer can be enhanced.

Examples of the support film 5 include those exemplified as the polymer films which can be used as the cover film 1. At this time, it is preferred that the film thicknesses of the support film and the cover film be adjusted by a surface treatment such that the cover film 1 is more preferentially peeled than the support film 5.

The thickness of the support film 5 is preferably 10 to 200 μm, more preferably 15 to 150 μm, particularly preferably 15 to 100 μm.

From the viewpoint of an enhancement in sensitivity and resolution, the haze value of the support film 5 is preferably 0.01 to 5.0%, more preferably 0.01 to 3.0%, still more preferably 0.01 to 2.0%, particularly preferably 0.01 to 1.0%. The haze value can be measured according to JTS K 7375 (specified in 2008). Moreover, the haze value can be also measured with a commercially available turbidity meter such as NDH-1001DP (manufactured by Nippon Denshoku Industries Co., Ltd., trade name).

Figure 2:
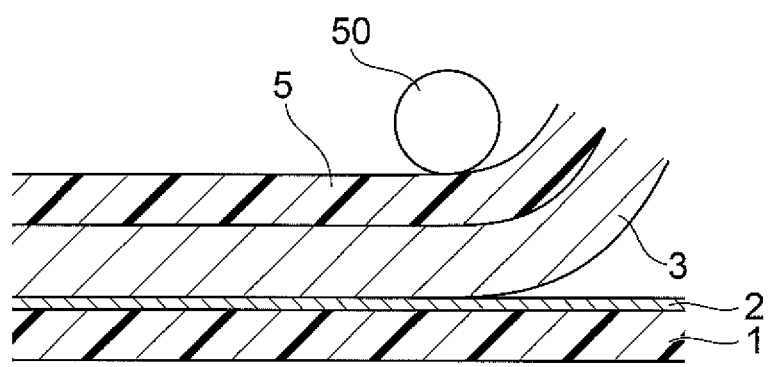
FIG. 2 is a schematic sectional view illustrating an example of a method of producing a photosensitive conductive film.

Although the method of producing the photosensitive conductive film according to the present embodiment of sequentially forming the conductive layer and the photosensitive resin layer on the cover film through application, the method of producing the photosensitive conductive film will not be limited to only this. Examples of the method include a method of sequentially forming a photosensitive resin layer and a conductive layer on a support film through application. Moreover, FIG. 2 is a schematic sectional view illustrating an example of a method of producing a photosensitive conductive film. The production method illustrated in FIG. 2 is characterized in that the conductive layer 2 is formed on a first film (cover film) 1, and the photosensitive resin layer 3 is separately formed on a second film (support film) 5. A photosensitive conductive film can be produced by laminating the two films thus obtained with a roller 50 such that the conductive layer 2 and the photosensitive resin layer 3 are laminated. According to this production method, the conductive layer and the photosensitive resin layer are separately formed; for this reason, control of the structure of each layer (such as the network structure of the conductive layer) can be more readily performed than the production method of layering and applying the solutions. At this time, it is preferred that the film having the conductive layer formed thereon and/or the film having the photosensitive resin layer formed thereon be heated to 60 to 130° C. to be laminated, and that the pressure during press bonding be about 0.2 to 0.8 MPa.

In the present embodiment, in the laminate of the conductive layer 2 and the photosensitive resin layer 3 (photosensitive layer 4), a minimum light transmittance in the wavelength band of 450 to 650 nm is preferably 80% or more, more preferably 85% or more. If the photosensitive layer 4 satisfies such a condition, an increase in luminance in display panels is facilitated. Moreover, when the total film thickness of both the conductive layer 2 and the photosensitive resin layer 3 forming the photosensitive layer 4 is 1 to 10 μm, the minimum light transmittance in the wavelength band of 450 to 650 nm is preferably 80% or more, more preferably 85% or more. If the conductive layer and the photosensitive resin layer satisfy such conditions, an increase in luminance in display panels is facilitated.

<Conductive Pattern Formation Method>

Figure 3:
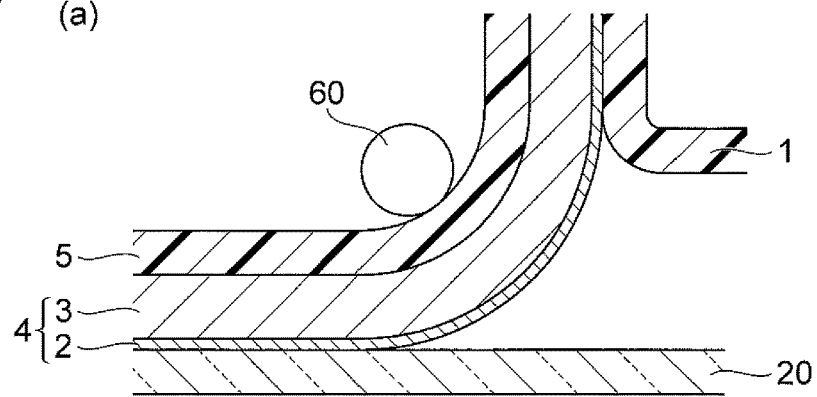
FIG. 3 is schematic sectional views for describing one embodiment of the conductive pattern formation method according to the present invention, (a) is a schematic sectional view illustrating a laminating step, (b) is a schematic sectional view illustrating a laminate formed through transfer of a photosensitive conductive film, (c) is a schematic sectional view illustrating an exposure step, and (d) is a schematic sectional view illustrating a developing step.
Figure 3:
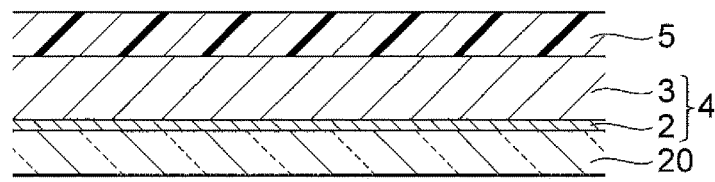
Figure 3:
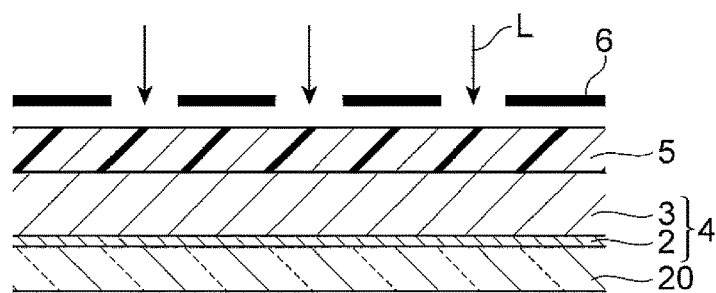
Figure 3:
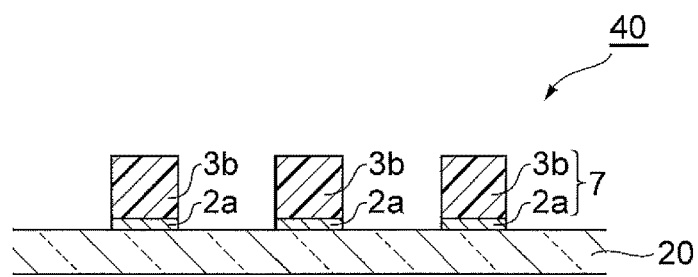

FIG. 3 is a schematic sectional view describing the conductive pattern formation method according to the present embodiment. The method according to the present embodiment comprises a step (hereinafter, also referred to as "laminating step") of peeling the cover film 1 and laminating the above-described photosensitive conductive film 10 with the roller 60 such that the conductive layer 2 is closely bonded to the base material 20 (FIG. 3(a) and FIG. 3(b)), and a step (hereinafter, also referred to as "patterning step") of exposing and developing the photosensitive layer on the base material to form a conductive pattern (FIG. 3(c) and FIG. 3(d)). The patterning step comprises an exposure step of irradiating a predetermined portion of the photosensitive layer 4 having the support film 5 with active light beams through a mask 6 (FIG. 3(c)), and a subsequent developing step of peeing the support film 5 and developing the photosensitive layer 4 (FIG. 3(d)).

As the base material 20, substrates such as glass substrates and plastic substrates made of polycarbonate can be used. The thickness of the base material 20 can be appropriately selected according to the purpose of use, and a base material in the form of a film can be used. Examples of the base material in the form of a film include poly(ethylene terephthalate) films, polycarbonate films, and cycloolefin polymer films. As the base material 20, a substrate having transparent electrodes already formed of ITO can be used. As the base material 20, those having a minimum light transmittance in the wavelength band of 450 to 650 nm of 80% or more are preferred. If the base material 20 satisfies such a condition, an increase in luminance in display panels is facilitated.

The laminating step is performed, for example, by a method of removing the cover film 1 of the photosensitive conductive film 10, and then performing lamination by press bonding the conductive layer 2 side to the base material 20 such as a glass substrate with heating. It is preferred that in this operation, lamination be performed under reduced pressure in view of adhesion and followability. In lamination of the photosensitive conductive film 10, it is preferred that the conductive layer 2 and the photosensitive resin layer 3 and/or the base material 20 be heated to 70 to 130° C.; this condition is not particularly limited. Moreover, although the base material 20 does not need to be preheated if the conductive layer 2 and the photosensitive resin layer 3 are heated to 70 to 130° C. as described above, the pre-heating of the base material 20 can be also performed to more significantly enhance lamination properties.

In lamination of the photosensitive conductive film 10, the pressure during press bonding is preferably about 0.1 to 1.0 MPa (about 1 to 10 kgf/cm$^2$), more preferably 0.2 to 0.8 MPa.

In the exposure step, the photosensitive resin layer is cured through irradiation with active light beams, and the conductive layer is fixed by the cured product to form a conductive pattern on the base material. Examples of the exposure method in the exposure step include a method of irradiating the photosensitive resin layer with active light beams L through a negative or positive mask pattern called art work in the form of an image (masked exposure method). As the light source for the active light beams, known light sources are used.

Although at this time, the amount of exposure of the active light beams L is varied according to the apparatuses to be used and the composition of the photosensitive resin composition, the amount of exposure is preferably 5 to 1000 mJ/cm$^2$, more preferably 10 to 200 mJ/cm$^2$. An amount of exposure of 10 mJ/cm$^2$ or more is preferred in view of high photo-curability, and an amount of exposure of 200 mJ/cm$^2$ or less is preferred in view of resolution. At an amount of exposure of 1000 mJ/cm$^2$ or less, coloring of the photosensitive layer can be prevented.

If the support film 5 on the photosensitive resin layer is transparent to the active light beams L, the photosensitive resin layer can be irradiated with the active light beams L through the support film 5; if the support film 5 is opaque, the photosensitive resin layer is irradiated with the active light beams after the support film 5 is removed.

As described above, in the photosensitive conductive film used in the present invention, the bonding strength of the cover film 1 and the support film 5 is controlled by the film thicknesses of the cover film 1 and the support film 5, selection of the materials for these films, and the surface treatment such that the cover film is peeled before the support film is peeled.

Moreover, if the base material 20 is transparent to the active light beams L, the photosensitive resin layer can be irradiated with the active light beams through the base material from the base material side; it is preferred in view of resolution that the photosensitive resin layer be irradiated with the active light beams from the photosensitive resin layer side.

According to the conductive pattern formation method according to the present embodiment, the photosensitive conductive film 10 separately prepared is laminated on the base material 20 to dispose the photosensitive layer 4; thereby, the photosensitive layer 4 can be formed on the base material 20 in a simpler manner to enhance productivity. Moreover, according to the conductive pattern formation method according to the present invention, a transparent conductive pattern can be readily formed on the base material such as a glass substrate or a plastic substrate.

In the developing step (step of forming a conductive pattern), unexposed portions (portions other than the exposed portions) in the photosensitive layer are removed. Specifically, if a transparent support film 5 is present on the photosensitive layer, first, the support film 5 is removed, and the unexposed portions of the photosensitive layer are then removed by wet development. Thereby, the conductive layer 2 containing conductive fibers are left under a cured resin layer 3b having a predetermined pattern to form a conductive pattern 2a. The cured resin layer 3b and the conductive pattern 2a are collectively referred to as a conductive pattern (cured product of the photosensitive layer) 7. A conductive pattern substrate 40 having a conductive pattern as illustrated in FIG. 3(d) is thus obtained.

Wet development is performed using a developing solution corresponding to the photosensitive resin, such as an alkaline aqueous solution, an aqueous developing solution, or an organic solvent-based developing solution by a known method, such as spraying, swing immersion, brushing, or scrapping.

As the developing solution, safe and stable developing solutions having high operationability, such as alkaline aqueous solutions are used. As the base of the alkaline aqueous solution, hydroxides (alkali hydroxides) of alkali metals such as lithium, sodium, and potassium; carbonates or bicarbonates (alkali carbonates) of lithium, sodium, potassium, and ammonium; borates or polyborates of lithium, sodium, potassium, and ammonium; alkali metal phosphates such as potassium phosphate and sodium phosphate; and alkali metal pyrophosphates such as sodium pyrophosphate and potassium pyrophosphate are used.

As the alkaline aqueous solution used in development, 0.1 to 5 mass % sodium carbonate aqueous solutions, 0.1 to 5 mass % potassium carbonate aqueous solutions, 0.1 to 5 mass % sodium hydroxide aqueous solutions, and 0.1 to 5 mass % sodium tetraborate aqueous solutions are preferred. Moreover, the pH of the alkaline aqueous solution used in development is preferably within the range of 9 to 11, and the temperature is controlled according to the developability of the photosensitive resin layer. Moreover, a surfactant, an antifoaming agent, and a small amount of organic solvent to promote development can be mixed with the alkaline aqueous solution.

Moreover, an aqueous developing solution composed of water or an alkali aqueous solution and one or more organic solvents can be used. Here, other than the bases described above, examples of the base contained in the alkali aqueous solution include borax, sodium metasilicate, tetramethylammonium hydroxide, ethanolamine, ethylenediamine, diethylenetriamine, 2-amino-2-hydroxymethyl-1, 3-propanediol, 1,3-diaminopropanol-2, and morpholine.

Examples of the organic solvent include methyl ethyl ketone, acetone, ethyl acetate, alkoxy ethanols having alkoxy groups having 1 to 4 carbon atoms, ethyl alcohol, isopropyl alcohol, butyl alcohol, diethylene glycol monomethyl ether, diethylene glycol monoethyl ether, and diethylene glycol monobutyl ether. These are used singly or in combinations of two or more.

In the aqueous developing solution, it is preferred that the concentration of the organic solvent be 2 to 90 mass %, and the temperature can be adjusted according to developability.

Furthermore, it is preferred that the pH of the aqueous developing solution be as low as possible within the range such that the development of the photosensitive resin layer can be sufficiently performed; a pH of 8 to 12 is preferred, and a pH of 9 to 10 is more preferred. Moreover, a small amount of surfactant and a small amount of antifoaming agent can be also added to the aqueous developing solution.

Examples of the organic solvent-based developing solution include 1,1,1-trichloroethane, N-methylpyrrolidone, N,N-dimethylformamide, cyclohexanone, methyl isobutyl ketone, and γ-butyrolactone. It is preferred that water be added to these organic solvents in the range of 1 to 20 mass % to prevent flash. Two or more of these developing solutions described above may be used in conjunction when necessary.

Examples of the developing method include methods such as dipping, battling, high pressure spraying, spraying, brushing, and slapping. Among these methods, it is preferred from the viewpoint of an enhancement in resolution that high pressure spraying be used.

In the conductive pattern formation method according to the present embodiment, heating at about 60 to 250° C. or exposure at about 0.2 to 10 $J/cm^2$ may be performed after development, when necessary, to further cure the conductive pattern.

As described above, according to the conductive pattern formation method according to the present embodiment, a transparent conductive pattern can be readily formed on a substrate such as a glass substrate or a plastic substrate without forming an etching resist as for an inorganic film of ITO.

The conductive pattern substrate according to the present embodiment comprises a substrate, and a conductive pattern composed of a conductive layer disposed on a substrate and a cured resin layer disposed on the conductive layer and containing an inorganic filler. The conductive pattern substrate according to the present invention can be obtained, for example, by the conductive pattern formation method described above.

The surface resistivity of the conductive pattern according to the present embodiment is preferably 2000 Ω/square or less, more preferably 1000 Ω/square or less, particularly preferably 500 Ω/square or less from the viewpoint that products can be effectively used as transparent electrodes or that good electrical connection can be ensured between the conductive pattern and the connection terminals disposed on the surface of the base material. The surface resistivity can be adjusted, for example, by the concentration of the conductive fiber dispersion liquid or the amount thereof to be applied.

In the conductive pattern substrate according to the present embodiment, the contact resistance between the conductive pattern and the connection terminals disposed on the surface of the base material is preferably $1\times10^6 \Omega$ or less, more preferably $200\times10^3 \Omega$ or less, still more preferably $20\times10^3 \Omega$ or less from the viewpoint that good electrical connection can be ensured. The contact resistance can be adjusted, for example, by the concentration of the conductive fiber dispersion liquid, the amount thereof to be applied, the pressure applied during lamination, and the content of the inorganic filler in the photosensitive resin layer.

In the conductive pattern substrate according to the present invention, the minimum light transmittance in the wavelength band of 450 to 650 nm is preferably 80% or more, more preferably 85% or more. If the conductive pattern substrate 40 satisfies such a condition, the visibility of display panels can be enhanced.

Figure 4:
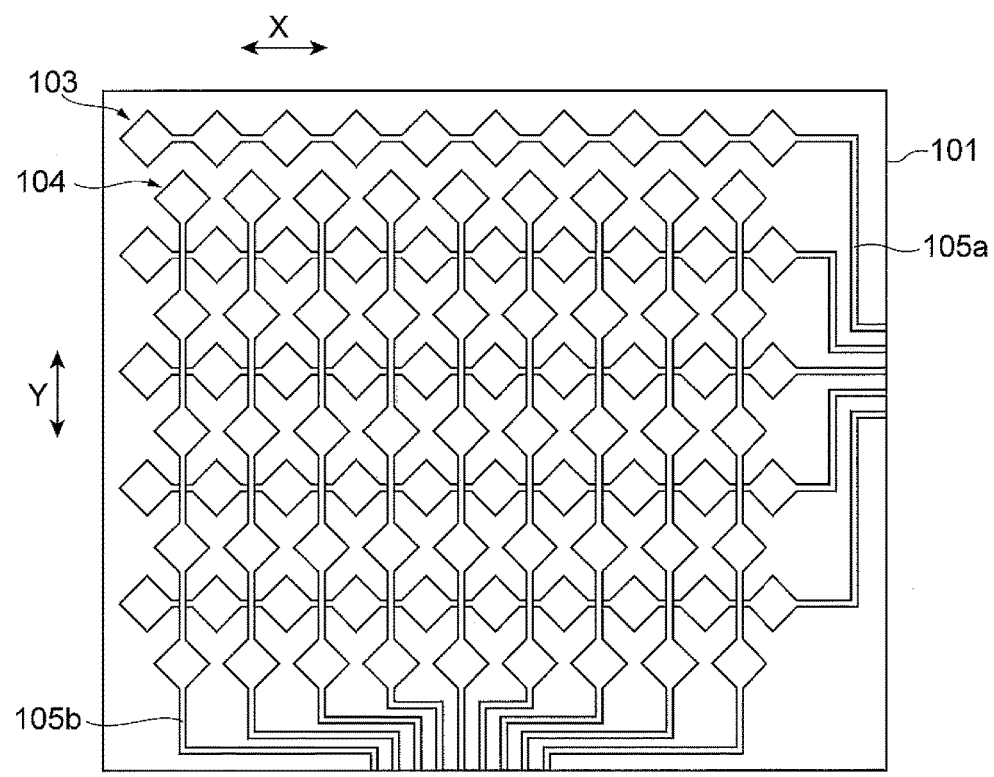
FIG. 4 is a plan view illustrating an example of a capacitive touch panel in which transparent electrodes are present on the same plane.
Figure 5:
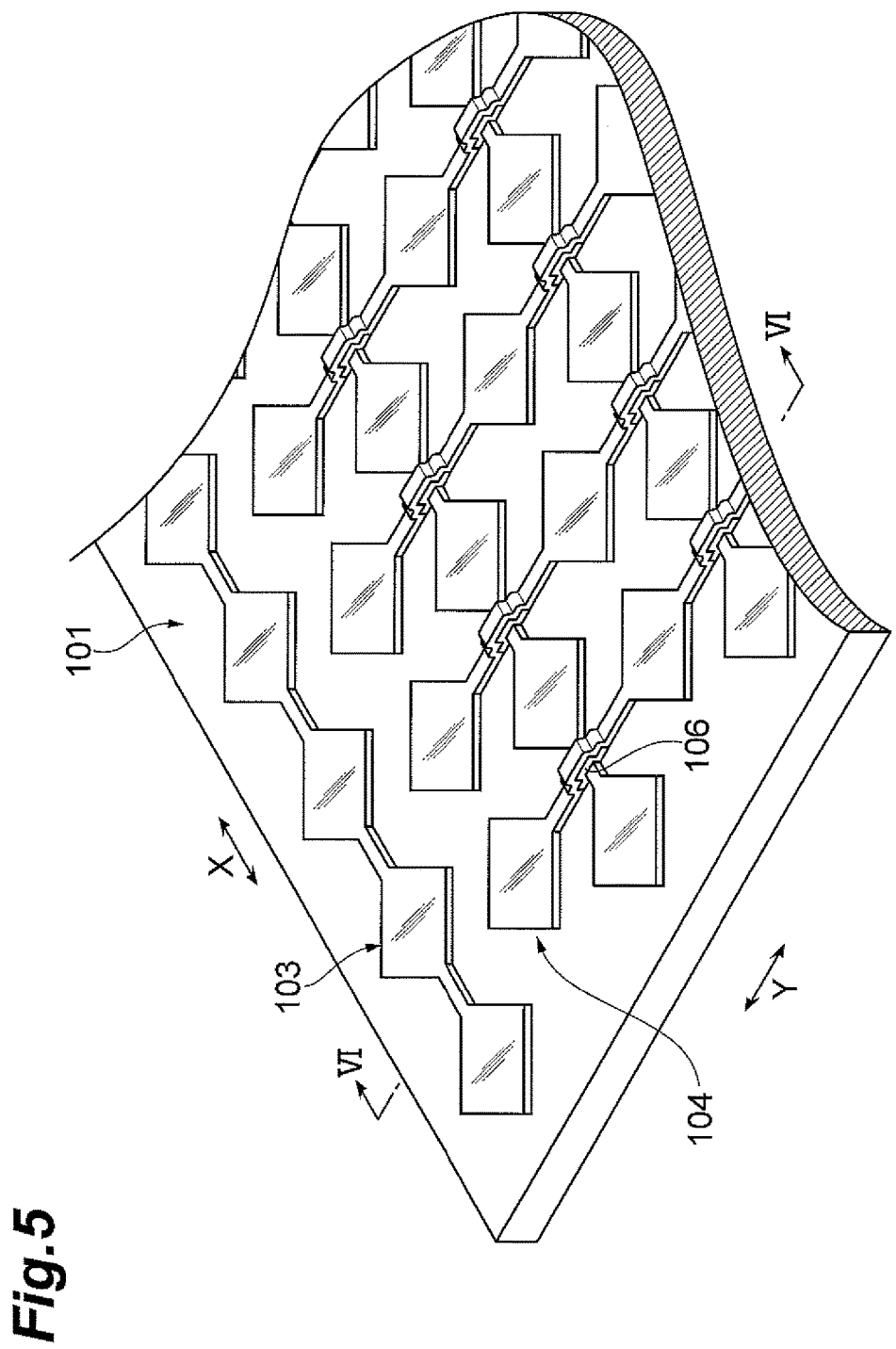
FIG. 5 is a partially cut-out perspective view illustrating an example of a capacitive touch panel in which transparent electrodes are present on the same plane.
Figure 6:
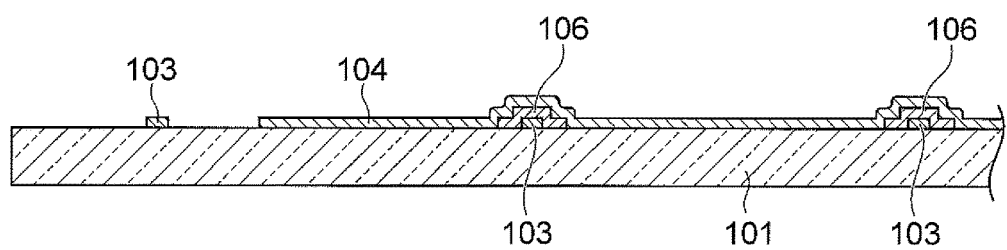
FIG. 6 is a partial sectional view taken along line VI-VI in FIG. 5.

The conductive pattern formation method according to the present invention can be preferably used in formation of the transparent electrodes for capacitive touch panels, for example. FIG. 4 is a plan view illustrating an example of a capacitive touch panel in which transparent electrodes (X position coordinates) 103 and transparent electrodes (Y position coordinates) 104 are present on the same plane, and FIG. 5 is a partially cut-out perspective view thereof. FIG. 6 is a partial sectional view taken along line VI-VI in FIG. 5. The capacitive touch panel includes, on a transparent substrate 101, the transparent electrodes 103 which detect a change in capacitance to determine the change as the X position coordinate and the transparent electrodes 104 which detect a change in capacitance to determine the change as the Y position coordinate. The transparent electrodes 103 and 104 to determine the change as the X and Y position coordinates each have drawing wirings 105a and 105b to connect to a control circuit of a driver element circuit (not shown) which controls electric signals as the touch panel.

An insulation film 106 is disposed at intersections between the transparent electrode (X position coordinate) 103 and the transparent electrode (Y position coordinate) 104. The insulation film is selected from materials having electrical insulation properties, transparency, and resistance against development. Examples of such a material include transparent photosensitive films in the form of a thin film.

A method of producing a capacitive touch panel by the conductive pattern formation method according to the present invention will be described. First, the transparent electrodes (X position coordinates) 103 are formed on the transparent substrate 101. Specifically, a photosensitive conductive film is laminated such that the conductive layer is in contact with the transparent substrate 101 (laminating step). The transferred photosensitive layer (conductive layer and photosensitive resin layer) is irradiated with active light beams into a pattern of a desired shape through a light shielding mask (exposure step). Subsequently, the light shielding mask is removed, the support film is further peeled, and development is performed to remove unexposed portions of the photosensitive layer to form a conductive pattern (developing step). The transparent electrodes 103 which detect the X position coordinate are formed by this conductive pattern.

Subsequently, the transparent electrodes (Y position coordinates) 104 are formed. The insulation film 106 is disposed on part of the transparent electrodes 103 formed through the steps above (for example, intersections between the transparent electrodes 103 and the transparent electrodes 104), a new photosensitive conductive film is further laminated on the transparent substrate 101, and the transparent electrodes 104 which detect the Y position coordinate are formed by the same operation as above. The transparent electrodes (X position coordinates) 103 and the transparent electrodes (Y position coordinates) 104 can be formed on the same plane through formation of transparent electrodes by the conductive pattern formation method according to the present invention. Moreover, because the conductive pattern is formed on the side of the transparent substrate 101, electrical conduction between the formed conductive pattern and the drawing wirings is facilitated during formation of the drawing wirings 105a and 105b.

Next, the drawing wirings 105a and 105b for connecting to an external circuit are formed on the surface of the transparent substrate 101. The drawing wirings can be formed, for example, using a conductive paste material containing silver flakes by a screen printing method.

In the method of producing a capacitive touch panel, one of the transparent electrodes (for example, the transparent electrodes (X position coordinates) 103) and the drawing wirings 105a and 105b can be preliminarily formed on the transparent substrate 101 by a known method using a transparent conductive material. Even in this case, the transparent electrodes (X position coordinates) 103 and the transparent electrodes (Y position coordinates) 104 can be formed on the same plane, and a conductive pattern having high adhesiveness and resolution can be obtained. Moreover, a conductive pattern of bridged transparent electrodes (Y position coordinates) 104 can be formed by patterning through the steps above.

Figure 7:
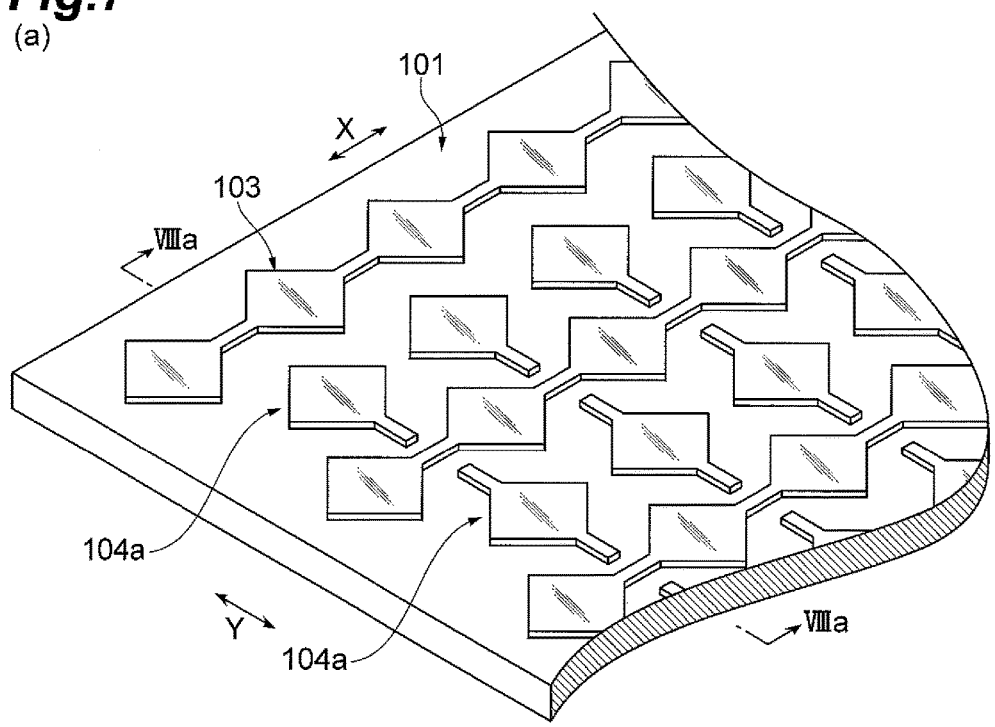
FIG. 7 is diagrams for describing an example of a method of producing a capacitive touch panel in which transparent electrodes are present on the same plane, (a) is a partially cut-out perspective view illustrating a substrate including transparent electrodes, and (b) is a partially cut-out perspective view illustrating a resulting capacitive touch panel.
Figure 7:
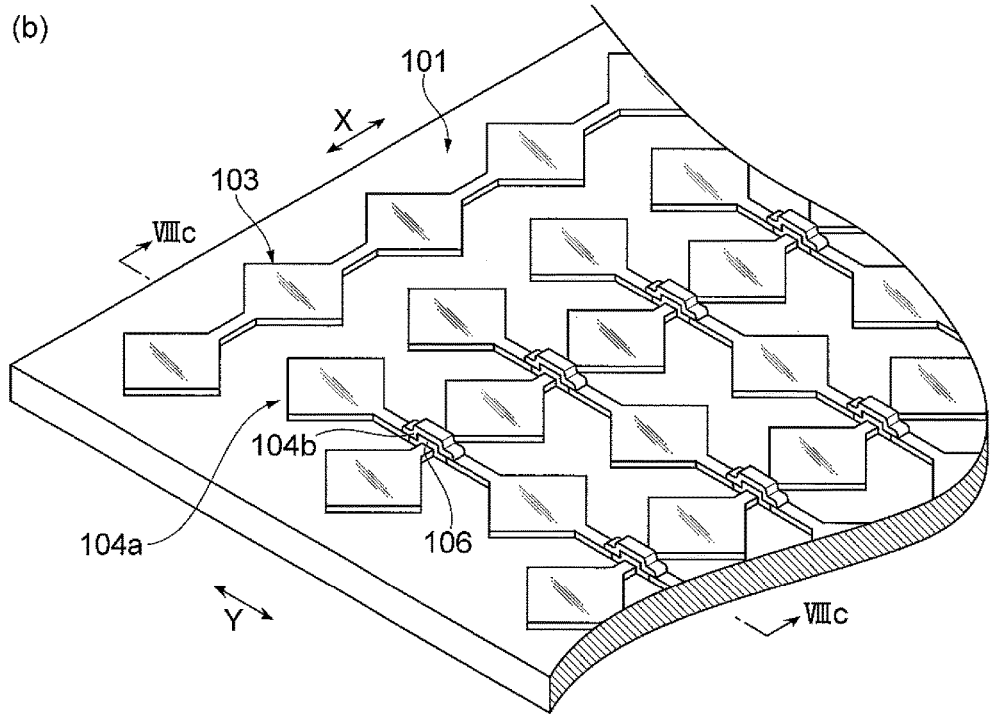
Figure 8:
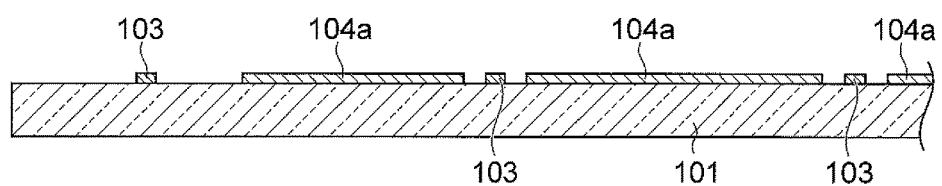
FIG. 8 is diagrams for describing an example of a method of producing a capacitive touch panel in which transparent electrodes are present on the same plane, (a) is a partial sectional view taken along line VIIIa-VIIIa in FIG. 7, (b) is a partial sectional view illustrating a step of disposing an insulation film, and (c) is a partial sectional view taken along line VIIIc-VIIIc in FIG. 7.
Figure 8:
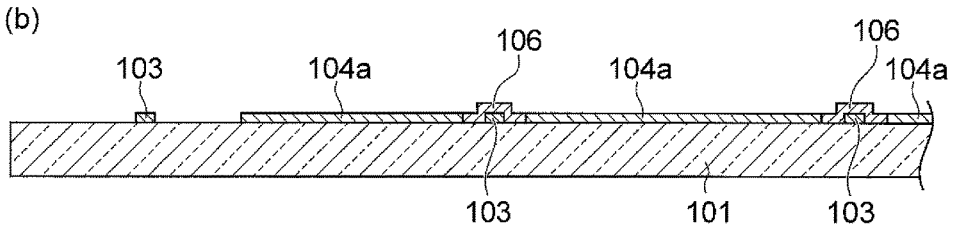
Figure 8:
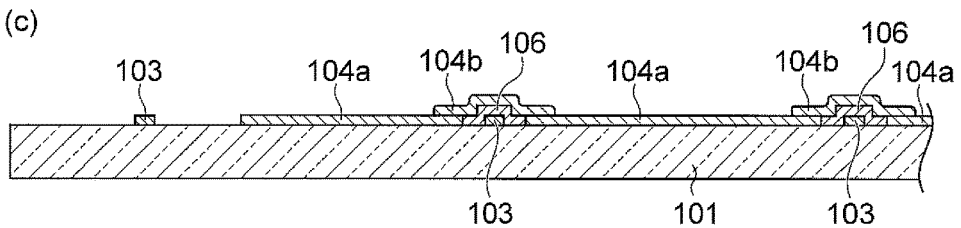
Figure 9:
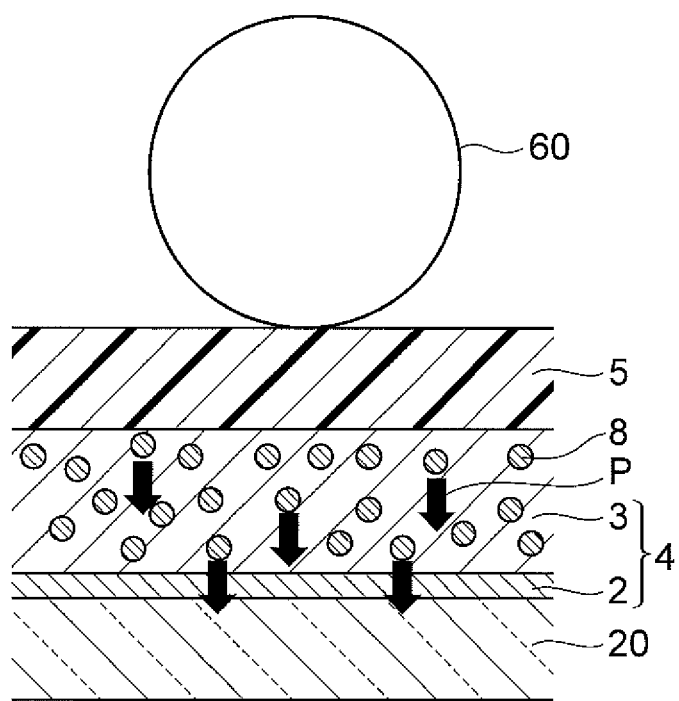
FIG. 9 is a schematic sectional view for describing an example of the effect of the action of the photosensitive conductive film according to the present invention.

Moreover, the method of producing a capacitive touch panel by the conductive pattern formation method according to the present invention will not be limited to the method above. For example, a substrate may be used in which the transparent electrodes (X position coordinates) 103, and part of the transparent electrodes serving, later, as the transparent electrodes 104 which detect the Y position coordinate are preliminarily formed on the transparent substrate 101 by a known method using a transparent conductive material. FIG. 7 is diagrams for describing an example of a method of producing a capacitive touch panel in which transparent electrodes are present on the same plane, (a) is a partially cut-out perspective view illustrating a substrate including transparent electrodes, and (b) is a partially cut-out perspective view illustrating the resulting capacitive touch panel. FIG. 8 is diagrams for describing an example of a method of producing a capacitive touch panel in which transparent electrodes are present on the same plane.

First, a substrate as illustrated in FIG. 7(a) and FIG. 8(a) on which the transparent electrodes (X position coordinates) 103 and part of transparent electrodes 104a are preliminarily formed is provided, and the insulation film 106 is disposed on part of the transparent electrodes 103 (portions between the parts of the transparent electrodes 104a) ((b) of FIG. 8). Subsequently, a photosensitive conductive film is laminated on the substrate, and a conductive pattern is formed by the same methods as those in the exposure step and the developing step described above. Bridge portions 104b for transparent electrodes can be formed by the conductive pattern (FIG. 8(c)). The parts of transparent electrodes 104a preliminarily formed can be electrically conducted by the bridge portions 104b for transparent electrodes, and the transparent electrodes (Y position coordinates) 104 are formed.

The transparent electrodes preliminarily formed may be formed by a known method using ITO, for example.

Moreover, the drawing wirings 105a and 105b can be formed by a known method using a metal such as Cu or Ag, in addition to the transparent conductive material. In the conductive pattern formation method according to the present invention, a substrate on which the drawing wirings 105a and 105b are preliminarily formed may be used. If such a substrate is used, according to the conductive pattern formation method according to the present invention, the transparent electrodes (Y position coordinates) can be formed in the state where the transparent electrodes (Y position coordinates) are insulated from the transparent electrodes (X position coordinates) while being directly electrically conducted to the drawing wirings, and a conductive pattern substrate can be produced in a simpler manner.

EXAMPLES

Hereinafter, the present invention will be specifically described based on Examples, but the present invention will not be limited to these.

<Preparation of Conductive Fiber Dispersion Liquid (Silver Fiber Dispersion Liquid)>
[Preparation of Silver Fibers by Polyol Method]

500 mL of ethylene glycol was placed in a 2000 mL three-necked flask, and was heated to 160° C. with an oil bath under a nitrogen atmosphere while being stirred with a magnetic stirrer. To this, a solution in which 2 mg of $PtCl_2$ separately provided was dissolved in 50 mL of ethylene glycol was added dropwise. After 4 to 5 minutes, a solution in which 5 g of $AgNO_3$ was dissolved in 300 mL of ethylene glycol and a solution in which 5 g of polyvinylpyrrolidone (manufactured by Wako Pure Chemical Industries, Ltd.) having a weight average molecular weight of 80000 was dissolved in 150 mL of ethylene glycol were simultaneously added dropwise from dropping funnels for one minute, and stirring was then performed at 160° C. for 60 minutes.

The reaction solution was left until the temperature reached 30° C. or less, was diluted with acetone 10 times, was centrifuged with a centrifuge at 2000 rpm for 20 minutes, and the supernatant solution was decanted. Acetone was added to the precipitate, the resultant was stirred and then centrifuged under the same conditions as above, and acetone was decanted. Subsequently, centrifugation was performed with distilled water in the same manner twice to obtain silver fibers. The resulting silver fibers were observed with an optical microscope; the fiber diameter (diameter) was about 40 nm, and the fiber length was about 4 μm.

[Preparation of Silver Fiber Dispersion Liquid]

The silver fibers obtained above and dodecyl-pentaethylene glycol were dispersed in pure water such that the concentration of the silver fibers was 0.2 mass % and that of dodecyl-pentaethylene glycol was 0.1 mass % to obtain Conductive fiber dispersion liquid 1.

<Preparation of Solution (X) of Photosensitive Resin Composition>
[Synthesis of Acrylic Resin]

400 g of a mixed solution of methyl cellosolve and toluene (methyl cellosolve/toluene=3/2 (mass ratio), hereinafter, referred to as "Solution s") was added to a flask provided with a stirrer, a reflux cooler, a thermometer, a dropping funnel, and a nitrogen gas introduction pipe, and was heated to 80° C. with stirring while nitrogen gas was being blown into the flask. On the other hand, a solution in which 100 g of methacrylic acid, 250 g of methyl methacrylate, 100 g of ethyl acrylate, and 50 g of styrene as monomers and 0.8 g of azobisisobutyronitrile as an initiator were mixed (hereinafter, referred to as "Solution a") was provided. Next, Solution a was added dropwise over 4 hours to Solution s heated to 80° C., and the temperature was then kept for 2 hours with stirring at 80° C. Furthermore, a solution in which 1.2 g of azobisisobutyronitrile was dissolved in 100 g of Solution s was added dropwise into the flask over 10 minutes. The solution after dropwise addition was kept at 80° C. for 3 hours with stirring, and was then heated to 90° C. over 30 minutes. The solution was kept at 90° C. for 2 hours, and was then cooled to obtain a binder polymer solution. Acetone was added to the binder polymer solution to adjust such that the non-volatile component (solid content) was 50 mass % to obtain a binder polymer solution as the (A) component. The weight average molecular weight of the resulting binder polymer was 80000 in terms of standard polystyrene determined by GPC. This was defined as Acrylic polymer A. The conditions of GPC measurement in measurement of the weight average molecular weight are as follows.

[Conditions of GPC Measurement]
Type of apparatus: Hitachi L6000 (manufactured by Hitachi, Ltd.)
Detection: L3300 RI (manufactured by Hitachi, Ltd.)
Columns: Gelpack GL-R440+GL-R450+GL-R400M (manufactured by Hitachi Chemical Company, Ltd.)
Specification of column: diameter 10.7 mm×300 mm
Solvent: THF (tetrahydrofuran)

Sample concentration: 120 mg of resin solution having NV (non-volatile content concentration) of 50 mass % was extracted, and dissolved in 5 mL of THF
Amount of injection: 200 μL
Pressure: 4.9 MPa
Flow rate: 2.05 mL/min

[Preparation of Solution (X) of Photosensitive Resin Composition]

The materials shown in Table 1 were compounded in the amount to be compounded (units: parts by mass) shown in Table 1 to prepare Solution (X) of photosensitive resin composition.

As the materials in Table 1, the followings were used.
(B) Component
PET-30: pentaerythritol triacrylate (manufactured by NIPPON KAYAKU Co., Ltd.)
(C) Component
OXE-01: 1,2-octanedione, 1-[4-(phenylthio)phenyl-2-(0-benzoyloxime)] (manufactured by BASF SE)
(D) Component
Silica filler A: organosilica sol (manufactured by Nissan Chemical Industries, Ltd., average primary particle size: 12 nm)
Other Components
SH-30: octamethylcyclotetrasiloxane (manufactured by Dow Corning Toray Co., Ltd.)
Methyl ethyl ketone (manufactured by Tonen Chemical Corporation)

TABLE 1

| Component | Material | Amount to be compounded (parts by mass) |
|---|---|---|
| (A) | Acrylic polymer A | 60 (Only solid content) |
| (B) | PET-30 | 40 |
| (C) | OXE-01 | 2.5 |
| (D) | Silica filler A | 100 (Only solid content) |
| Other | SH-30 | 0.1 |
| components | Methyl ethyl ketone | 100 |

Example 1

<Preparation of Photosensitive Conductive Film>

Conductive fiber dispersion liquid 1 was uniformly applied onto a polyethylene terephthalate film (PET film, manufactured by TEIJIN LIMITED, trade name: G2-16) provided as a first film (cover film) having a thickness of 16 μm at 20 g/m$^2$, and was dried with a 100° C. hot air convection dryer for 10 minutes; pressure was applied at room temperature (25° C.) and a line pressure of 1 MPa to form a conductive layer containing conductive fibers on the first film. The film thickness was measured with a scanning electron microscope photograph; the film thickness of the conductive layer after drying was about 0.1 μm.

Next, Solution (X) of photosensitive resin composition was uniformly applied onto a polyethylene terephthalate film (PET film, manufactured by TEIJIN LIMITED, trade name: G2-50) separately provided as a second film (support film) having a thickness of 50 μm, and was dried with a 100° C. hot air convection dryer for 10 minutes to form a photosensitive resin layer on the second film. The film thickness was measured with a scanning electron microscope photograph; the film thickness of the photosensitive resin layer after drying was 5 μm.

The PET film having the conductive layer formed thereon and the PET film having the photosensitive resin layer formed thereon obtained as above were disposed with the conductive layer facing the photosensitive resin layer, and were laminated under the conditions at 120° C. and 0.4 MPa to prepare a target photosensitive conductive film.

<Measurement of Surface Resistivity and Light Transmittance>

A polycarbonate substrate having a thickness of 1 mm was heated to 80° C.; the conductive layer faced the polycarbonate substrate while the cover film (PET film having a thickness of 16 μm) was being peeled, and the photosensitive conductive film obtained in Example 1 was laminated on the surface of the polycarbonate substrate under the conditions at 120° C. and 0.4 MPa. After lamination, the substrate was cooled; when the temperature of the substrate reached 23° C., the photosensitive layer (conductive layer and photosensitive resin layer) was irradiated with light from the side of the support film (PET film having a thickness of 50 μm) using an exposing apparatus having an ultra-high pressure mercury lamp (manufactured by ORC MANUFACTURING CO., LTD., trade name: EXM-1201) at an amount of exposure of 1000 mJ/cm$^2$. After exposure, the substrate was left at room temperature (25° C.) for 15 minutes, and subsequently the PET film as the support film was peeled to form a conductive film containing silver fibers on the polycarbonate substrate to obtain a conductive film substrate. The surface resistivity and the minimum light transmittance in the wavelength band of 450 to 650 nm of the resulting conductive film substrate were evaluated. The surface resistivity of the conductive film measured with the following measurement apparatus was 150 Ω/square, and the minimum light transmittance in the wavelength band of 450 to 650 nm (including the substrate) was 90%.

[Measurement of Surface Resistivity]

A measurement probe was applied from the conductive film side with a non-contact type surface resistance meter (manufactured by NAPSON CORPORATION, EC-80P) to measure the surface resistivity of the conductive film formed on the polycarbonate substrate.

[Measurement of Light Transmittance]

The minimum light transmittance in the wavelength band of 450 to 650 nm was measured with a spectrophotometer (manufactured by Hitachi High-Technologies Corporation, trade name "U-3310").

[Measurement of Primary Particle Size of Inorganic Filler]

In the conductive film substrate obtained above, a sample of a thin film piece is prepared with an FIB-SEM by a focused ion beam processing method to cut out the cross section of the photosensitive resin layer 3. Subsequently, the sample of a thin film piece was observed with a TEM (transmission electron microscope, manufactured by JEOL Ltd.; JEM-2100F) at a magnification of 100000 times to 300000 times. All of the particle sizes in the region (2 μm×2 μm) containing the largest number of inorganic fillers in the observed cross section were measured; the average value was 12 nm. As the method of preparing a sample of the cross section of a thin film other than the focused ion beam processing method, there are methods of processing a thin film by an ultramicrotome method and a cryo-ultramicrotome processing method.

<Evaluation of Electrical Connection to Connection Terminals on Surface of Base Material>

[Preparation of Substrate for Evaluation]

An ITO-PET film substrate (thickness: 100 μm, surface resistivity: 150 Ω/square) was heated to 80° C., and a resist film for etching ITO (manufactured by Hitachi Chemical Company, Ltd., ME-3315) was laminated on the surface thereof (ITO side) under the conditions at a laminating roll temperature of 110° C., a laminating pressure of 0.4 MPa, and a laminating rate of 1 m/min. After lamination, the substrate was cooled; when the temperature of the substrate reached 23° C., a photo mask having a wiring pattern having line width/space width of 1 mm/1 mm and a length of 50 mm was closely bonded on the surface of the PET film as the cover film. The etching resist was irradiated with light using an exposing apparatus having an ultra-high pressure mercury lamp (manufactured by ORC MANUFACTURING CO., LTD., trade name: EXM-1201) at an amount of exposure of 200 mJ/cm$^2$.

After exposure, the substrate was left at room temperature (25° C.) for 15 minutes, subsequently, the PET film as the cover film was peeled, and development was performed by spraying a 1 mass % sodium carbonate aqueous solution at 30° C. for 16 seconds. After development, an etching resist pattern having line width/space width of about 1 mm/1 mm was formed on the ITO-PET film substrate. Subsequently, the ITO-PET film substrate was immersed in a 25 volume % hydrochloric acid (solution temperature: 50° C.) for 1 minute to dissolve and remove ITO not covered with the resist pattern.

The ITO-PET film substrate after ITO was dissolved and removed was immersed in a 3 mass % sodium hydroxide aqueous solution (solution temperature: 25° C.) for 2 minutes to peel the resist pattern; an ITO-PET film substrate on which an ITO pattern having line width/space width of 1 mm/1 mm and a length of 50 mm was formed (ITO line pattern formed substrate) was prepared.

[Formation of Conductive Pattern]

The resulting ITO line pattern formed substrate was heated to 80° C.; the conductive layer faced the ITO line pattern formed substrate while the first film was being peeled, and the photosensitive conductive film obtained in Example 1 was laminated on the surface (ITO line pattern formed surface) of the ITO line pattern formed substrate under the conditions at 120° C. and 0.4 MPa. After lamination, the substrate was cooled; when the temperature of the substrate reached 23° C., a photo mask having a wiring pattern having a line width of 1 mm and a length of 3 mm was closely bonded on the surface of the PET film as the second film. The photo mask was disposed such that the wiring pattern was orthogonal to the ITO line pattern of the substrate for evaluation. The photosensitive layer (conductive layer and photosensitive resin layer) was irradiated with light using an exposing apparatus having an ultra-high pressure mercury lamp (manufactured by ORC MANUFACTURING CO., LTD., trade name: EXM-1201) at an amount of exposure of 40 mJ/cm$^2$ (measurement value in i rays (wavelength: 365 nm)).

After exposure, the substrate was left at room temperature (25° C.) for 15 minutes, subsequently, the PET film as the cover film was peeled, and development was performed by spraying a 1 mass % sodium carbonate aqueous solution at 30° C. for 30 seconds. After development, the photosensitive layer composed of the conductive layer containing silver fibers and the photosensitive resin layer containing a photosensitive resin and an inorganic filler was irradiated with ultraviolet light from above the photosensitive resin layer at an amount of exposure of 1 J/cm$^2$ (measurement value in i rays (wavelength: 365 nm)) to form the conductive pattern (cured product of the photosensitive layer) 7 having a line width of about 1 mm and a length of about 3 mm on the ITO line pattern formed substrate. The conductive pattern 7 was formed orthogonal to two ITO line patterns having a space of 1 mm in width and disposed parallel. This was used as a substrate for evaluation for evaluating electrical connection of the photosensitive conductive film.

Figure 10:
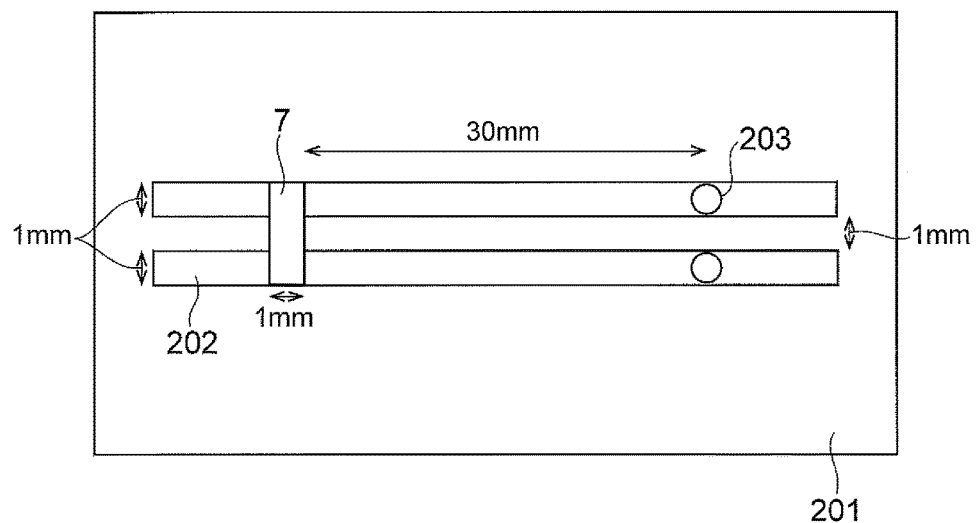
FIG. 10 is a schematic view for describing a method of evaluating the electrical connection between a conductive pattern formed with the photosensitive conductive film according to the present invention and the connection terminals on the surface of the substrate.

In a substrate for evaluation 201 obtained, silver paste electrodes 203 were formed on two ITO line patterns 202 disposed on the substrate for evaluation 201 as illustrated in FIG. 10. The silver paste electrodes 203 each were formed by applying a silver paste (manufactured by TOYOBO CO., LTD., DW-117) at a position of 30 mm from where the conductive pattern 7 was formed in a semi-sphere shape (diameter: 500 μm) on the ITO line pattern 202, and then drying the paste on a hot plate at 90° C. for 5 min. One silver paste electrode 203 was formed on each of the two ITO line patterns 202.

A pocket tester was brought into contact with the two silver paste electrodes 203 formed to measure the resistance value of the two ITO line patterns 202 connected by the conductive pattern (cured product of the photosensitive layer) 7. The resistance value was defined as a line resistance value (R1) to evaluate the electrical connection of the conductive pattern formed with the photosensitive conductive film (contact resistance between the ITO line pattern and the conductive pattern according to the present invention). The resistance value could not be measured up to 32×10$^6$Ω because of the specification of the pocket tester, and electrical disconnection (OL; Over Load) occurred at a resistance value of more than 32×10$^6$Ω.

The electrical connection of the conductive pattern formed with the photosensitive conductive film was evaluated based on the line resistance value R1 according to the following evaluation points:

$R1 \leq 20 \times 10^3 \Omega$                          A;

$20 \times 10^3 \Omega < R1 \leq 200 \times 10^3 \Omega$            B;

$200 \times 10^3 \Omega < R1 \leq 1 \times 10^6 \Omega$              C;

$1 \times 10^6 \Omega < R1$                               D;

The electrical connection of the conductive pattern formed with the photosensitive conductive film obtained in Example 1 was evaluated; the evaluation point was A. It was verified that the conductive pattern connected the two ITO line patterns in an electrically good manner.

Examples 2 to 10, and Comparative Examples 1 and 2

Photosensitive conductive films were prepared in the same manner as in Example 1 except that Solutions (X) of photosensitive resin composition prepared with the materials shown in Table 2 at the amounts to be compounded shown in Table 2 (units: parts by mass) were used, and the surface resistivity of the conductive pattern, the light transmittance thereof, and the electrical connection to the connection terminals on the surface of the base material were evaluated. The results are shown in Table 2.

As the materials shown in Table 2, the followings were used.

(B) Component

PET-30: pentaerythritol triacrylate (manufactured by NIPPON KAYAKU Co., Ltd.)

TMPTA: trimethylolpropane triacrylate (manufactured by NIPPON KAYAKU Co., Ltd.)

(C) Component

OXE-01: 1,2-octanedione, 1-[4-(phenylthio)phenyl-2-(O-benzoyloxime)] (manufactured by BASF SE)

(D) Component
Silica filler A: organosilica sol (manufactured by Nissan Chemical Industries, Ltd., average primary particle size: 12 nm)
Silica filler B: silica filler (ADMAFINE, manufactured by Admatechs Company Limited, average primary particle size: 500 nm)
Zirconium oxide filler: (NanoUse, manufactured by Nissan Chemical Industries, Ltd., average primary particle size: 90 nm)
ITO particulate filler: (transparent conductive powder ITO, manufactured by Mitsubishi Materials Electronic Chemicals Co., Ltd., average primary particle size: 30 nm)
Other Components
SH-30: octamethylcyclotetrasiloxane (manufactured by Dow Corning Toray Co., Ltd.)
Methyl ethyl ketone (manufactured by Tonen Chemical Corporation)

(A) Component
Acrylic polymer A: acrylic resin at a copolymerization ratio of methacrylic acid/methyl methacrylate/ethyl acrylate/styrene=20/50/20/10, weight average molecular weight: 80000
Acrylic polymer B: acrylic resin at a copolymerization ratio of methacrylic acid/methyl methacrylate/ethyl acrylate/2-hydroxyethyl methacrylate=20/50/20/10, weight average molecular weight: 85000
(B) Component
PET-30: pentaerythritol triacrylate (manufactured by NIPPON KAYAKU Co., Ltd.)
DPHA: dipentaerythritol hexaacrylate (manufactured by NIPPON KAYAKU Co., Ltd.)
(C) Component
OXE-01: 1,2-octanedione, 1-[4-(phenylthio)phenyl-2-(O-benzoyloxime)] (manufactured by BASF SE)

TABLE 2

| | Items | | Example 1 | 2 | 3 | 4 | 5 | 6 | 7 | 8 | 9 | 10 | Comparative Example 1 | 2 |
|---|---|---|---|---|---|---|---|---|---|---|---|---|---|---|
| Photosensitive resin composition solution (X) | (A) | Acrylic polymer A | 60 | 60 | 60 | 60 | 60 | 60 | 60 | 60 | 60 | 60 | 60 | 60 |
| | (B) | PET-30 | 40 | — | 40 | 40 | 40 | 40 | 40 | 40 | 40 | 40 | 40 | — |
| | | TMPTA | — | 40 | — | — | — | — | — | — | — | — | — | 40 |
| | (C) | OXE-01 | 2.5 | 2.5 | 2.5 | 2.5 | 2.5 | 2.5 | 2.5 | 2.5 | 2.5 | 2.5 | 2.5 | 2.5 |
| | (D) | Silica filler A | 100 | 100 | 230 | 65 | 45 | 25 | 10 | — | — | — | — | — |
| | | Silica filler B | — | — | — | — | — | — | — | 100 | — | — | — | — |
| | | Zirconium oxide filler | — | — | — | — | — | — | — | — | 100 | — | — | — |
| | | ITO particulate filler | — | — | — | — | — | — | — | — | — | 100 | — | — |
| | Other components | SH-30 | 0.1 | 0.1 | 0.1 | 0.1 | 0.1 | 0.1 | 0.1 | 0.1 | 0_1 | 0.1 | 0.1 | 0.1 |
| | | Methyl ethyl ketone | 100 | 100 | 150 | 100 | 100 | 100 | 100 | 100 | 100 | 100 | 100 | 100 |
| Results of evaluation | Surface resistivity (Ω/square) | | 150 | 150 | 145 | 150 | 151 | 151 | 152 | 149 | 150 | 135 | 154 | 153 |
| | Evaluation of electrical connection of conductive pattern | | A | A | B | A | B | C | C | B | A | A | D | D |
| | Light transmittance (%) | | 90 | 90 | 89 | 90 | 90 | 91 | 91 | 75 | 87 | 89 | 91 | 91 |

As shown in Table 2, irrespective of the other compositions of the photosensitive resin composition solutions, Examples 1 to 10 using the photosensitive conductive films comprising the photosensitive resin layers containing inorganic fillers as the (D) component exhibited excellent electrical connection of the conductive patterns compared to Comparative Examples 1 and 2 not containing the inorganic filler.

Moreover, as shown in Table 2, Example 8 in combination with a silica filler having a primary particle size of 500 μm as the (D) inorganic filler exhibited a good result in the electrical connection of the conductive pattern although the light transmittance was 75%.

Examples 11 to 13

Photosensitive conductive films were prepared in the same manner as in Example 1 except that Solutions (X) of photosensitive resin composition prepared with the materials shown in Table 3 at the amounts to be compounded shown in Table 3 (units: parts by mass), and the surface resistivity of the conductive pattern, the light transmittance thereof, and the electrical connection to the connection terminals on the surface of the base material were evaluated. The results are shown in Table 3.

As the materials shown in Table 2, the followings were used.

TPO: 2,4,6-trimethylbenzoyl-diphenylphosphine oxide (manufactured by BASF SE)
(D) Component
Silica filler A: organosilica sol (manufactured by Nissan Chemical Industries, Ltd., average primary particle size: 12 nm)
Other Components
SH-30: octamethylcyclotetrasiloxane (manufactured by Dow Corning Toray Co., Ltd.)
Methyl ethyl ketone (manufactured by Tonen Chemical Corporation)

TABLE 3

| | Items | | Example 11 | 12 | 13 |
|---|---|---|---|---|---|
| Photosensitive resin composition solution (X) | (A) | Acrylic polymer A | — | 60 | 60 |
| | | Acrylic polymer B | 60 | — | — |
| | (B) | PET-30 | 40 | — | 40 |
| | | DPHA | — | 40 | — |
| | (C) | OXE-01 | 2.5 | 2.5 | — |
| | | TPO | — | — | 5 |
| | (D) | Silica filler A | 100 | 100 | 100 |
| | Other components | SH-30 | 0.1 | 0.1 | 0.1 |
| | | Methyl ethyl ketone | 100 | 100 | 100 |
| Results of evaluation | Surface resistivity (Ω/square) | | 151 | 150 | 151 |
| | Evaluation of electrical connection of conductive pattern | | A | A | B |
| | Light transmittance (%) | | 91 | 90 | 91 |

As shown in Table 3, good results of evaluation were shown even if the (A) to (C) components were varied.

INDUSTRIAL APPLICABILITY

According to the photosensitive conductive film according to the present invention, a conductive pattern having sufficiently low surface resistivity can be formed on a base material in sufficient resolution in a simple manner, and a conductive pattern which can be electrically connected to connection terminals disposed on the surface of the substrate can be formed.

REFERENCE SIGNS LIST

1 . . . first film (cover film), 2 . . . conductive layer, 2a . . . conductive pattern, 3 . . . photosensitive resin layer, 3b . . . cured resin layer, 4 . . . photosensitive layer, 5 . . . second film (support film), 7 . . . conductive pattern (cured product of photosensitive layer), 8 . . . inorganic filler, 10 . . . photosensitive conductive film, 20 . . . base material, 50, 60 . . . roller, 101 . . . transparent substrate, 103 . . . transparent electrode (X position coordinate), 104 . . . transparent electrode (Y position coordinate), 104a . . . part of transparent electrodes, 104b . . . bridge portion of transparent electrodes, 105a, 105b . . . drawing wirings, 106 . . . insulation film, 201 . . . substrate for evaluation, 202 . . . ITO line pattern, 203 . . . silver paste electrode.

The invention claimed is:

1. A conductive pattern formation method, comprising:
a step of providing a photosensitive conductive film including a conductive layer containing conductive fibers, a photosensitive resin layer containing a photosensitive resin and an inorganic filler, wherein an average primary particle size of the inorganic filler is 200 nm or less, and a support film in this order, and laminating the conductive layer and the photosensitive resin layer on a base material such that the conductive layer side is closely bonded to the base material; and
a step of exposing and developing the photosensitive resin layer and the conductive layer on the base material to form a conductive pattern on the base material.

2. The conductive pattern formation method according to claim 1, wherein the inorganic filler contains an inorganic filler having a primary particle size of 1 to 1000 nm.

3. The conductive pattern formation method according to claim 1, wherein the photosensitive resin layer comprises a binder polymer, a photopolymerizable compound having an ethylenically unsaturated bond, and a photopolymerization initiator.

4. The conductive pattern formation method according to claim 3, wherein the binder polymer has a carboxyl group.

5. The conductive pattern formation method according to claim 1, wherein a laminate of the conductive layer and the photosensitive resin layer has a minimum light transmittance of 80% or more in the wavelength band of 450 to 650 nm.

6. The conductive pattern formation method according to claim 1, wherein the conductive pattern comprises the conductive layer including conductive fibers disposed on the base material and a cured portion of the photosensitive resin layer disposed on the conductive layer.

7. A conductive pattern formation method, comprising:
providing a photosensitive conductive film including a conductive layer containing conductive fibers, a photosensitive resin layer containing a photosensitive resin and an inorganic filler, wherein an average primary particle size of the inorganic filler is 200 nm or less, and a support film in this order;
laminating the conductive layer and the photosensitive resin layer on a base material such that the conductive layer is in direct contact with the base material; and
exposing and developing the photosensitive resin layer and the conductive layer on the base material to form a conductive pattern on the base material.

8. (Withdrawn and Currently Amended)The conductive pattern formation method according to claim 7, wherein the conductive pattern comprises the conductive layer including conductive fibers disposed on the base material and a cured portion of the photosensitive resin layer disposed on the conductive layer.

9. The conductive pattern formation method according to claim 7, wherein the inorganic filler contains an inorganic filler having a primary particle size of 1 to 1000 nm.

10. The conductive pattern formation method according to claim 9, wherein the conductive pattern comprises the conductive layer including conductive fibers disposed on the base material and a cured portion of the photosensitive resin layer disposed on the conductive layer.

11. The conductive pattern formation method according to claim 7, wherein the photosensitive resin layer comprises a binder polymer, a photopolymerizable compound having an ethylenically unsaturated bond, and a photopolymerization initiator.

12. The conductive pattern formation method according to claim 11, wherein the binder polymer has a carboxyl group.

13. The conductive pattern formation method according to claim 7, wherein a laminate of the conductive layer and the photosensitive resin layer has a minimum light transmittance of 80% or more in the wavelength band of 450 to 650 nm.

* * * * *